(12) United States Patent
Bronson et al.

(10) Patent No.: US 12,744,105 B2
(45) Date of Patent: Sep. 22, 2026

(54) PARTIAL ARRAY SPARING IN A MEMORY

(71) Applicant: International Business Machines Corporation, Armonk, NY (US)

(72) Inventors: Timothy Bronson, Round Rock, TX (US); Gregory William Alexander, Pflugerville, TX (US); Hieu Trong Huynh, Austin, TX (US); Ashraf ElSharif, Austin, TX (US); Saul Bernaber, Milford, CT (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 18/789,005

(22) Filed: Jul. 30, 2024

(65) Prior Publication Data

US 2026/0038627 A1 Feb. 5, 2026

(51) Int. Cl.
*G11C 29/00* (2006.01)
*G11C 29/18* (2006.01)

(52) U.S. Cl.
CPC ............ *G11C 29/789* (2013.01); *G11C 29/18* (2013.01); *G11C 29/70* (2013.01); *G11C 29/785* (2013.01); *G11C 29/81* (2013.01); *G11C 2029/1802* (2013.01)

(58) Field of Classification Search
CPC ....... G11C 29/789; G11C 29/18; G11C 29/70; G11C 29/785; G11C 29/81; G11C 2029/1802
See application file for complete search history.

(56) References Cited

U.S. PATENT DOCUMENTS 5,208,782 A * 5/1993 Sakuta .................. G11C 11/406 257/784
10,579,464 B2 3/2020 Das
11,221,794 B2 1/2022 Bronson
11,749,370 B2 9/2023 Wu
2002/0109154 A1* 8/2002 Lee ...................... G11C 29/808 257/200
2002/0157051 A1* 10/2002 Eckelman ............ G06F 11/263 714/736
2009/0106607 A1* 4/2009 Bronson ............. G11C 29/816 714/E11.09

(Continued)

OTHER PUBLICATIONS

“A Smart Sparing System for De-Clustered Raid Storage,” Apr. 21, 2016, 9 pages, IPCOM000245964D, ip.com.

(Continued)

*Primary Examiner* — Mushfique Siddique
(74) *Attorney, Agent, or Firm* — Cantor Colburn LLP; Edward Wixted

(57) ABSTRACT

An integrated circuit includes a semiconductor substrate and integrated circuitry on the semiconductor substrate. The integrated circuitry includes a memory array including a plurality of memory macros including at least first and second memory macros. Each of the plurality of memory macros includes multiple partial arrays and a shared macro controller configured to control read and write access to the multiple partial arrays. The memory array also includes spare access control logic configured to direct an access to a first partial array in the first memory macro to a second partial array in the second memory macro.

20 Claims, 13 Drawing Sheets

(56) References Cited

U.S. PATENT DOCUMENTS

| | | | | |
|---|---|---|---|---|
| 2010/0211836 | A1* | 8/2010 | Kodama | G06F 11/27 714/721 |
| 2011/0320862 | A1* | 12/2011 | Blake | G11C 29/883 714/E11.169 |
| 2019/0096508 | A1* | 3/2019 | Kim | G11C 8/08 |
| 2019/0348140 | A1* | 11/2019 | Cho | G11C 11/4087 |
| 2020/0264803 | A1* | 8/2020 | Bronson | G06F 11/0751 |
| 2020/0365226 | A1* | 11/2020 | Ryu | G11C 11/4097 |
| 2023/0377671 | A1 | 11/2023 | Wu | |
| 2024/0355382 | A1* | 10/2024 | Jungmann | G11C 11/417 |

OTHER PUBLICATIONS

"Automatic Sparing Operation Using Spare Row and Chipkill," Mar. 9, 2015, 3 pages, IPCOM000240887D, ip.com.

"Dynamic DQ Lane Repair in a High Reliability (Raim) Memory System," Oct. 14, 14 2021, 9 pages, IPCOM000267300D, ip.com.

Gonzalez, J. et al., "Finding Defective Elements in Planar Array Using Genetic Algorithms," Progress in Electromagnetics Research, Pier 29, 25-37, 2000.

Liu, S. et al., "Generalized Array Architecture With Multiple Sub-Arrays and Hole-Repair Algorithm for Doa Estimation," Computers, Materials & Continua (CMC), vol. 64, No. 1, pp. 589-605, 2020.

Ramadan, NH. et al.; Redundancy Yield Model for Srams, 8 pages, 1997, Intel Technology Journal.

* cited by examiner

PARTIAL ARRAY SPARING IN A MEMORY

BACKGROUND OF THE INVENTION

This disclosure relates to memory and, in particular, to partial memory array sparing in a memory of an integrated circuit chip.

State-of-the-art integrated circuit chips commonly include multiple redundant instances of circuit structures to improve the manufacturing yield and/or to extend the useful service life of the integrated circuit chips. For example, an integrated circuit chip incorporating a memory array can include, within the memory array, redundant components, such as additional rows and columns of memory cells, in excess of those concurrently placed in service in normal operation. If a manufacturing defect in a component of the memory array or an in-service failure of a component of the memory array is detected, hardware or firmware can substitute a redundant component in place of the defective or failed component. Similarly, an integrated circuit chip can include multiple redundant instances of the memory array itself, where at least some of the memory array instances are configured as "spare" memory arrays that can replace a memory array in which defect(s) and/or failure(s) are detected.

Conventionally, implementing redundant (i.e., spare) memory array instances within an integrated circuit chip is viewed as a design tradeoff between the limited available budgets for chip area, chip wiring, and power dissipation. In general, adding more spare memory array instances desirably boosts the yield of an integrated circuit chip and extends the useful service life of an integrated circuit chip; however, the solution of increasing the number of spare memory array instances in the design consumes valuable chip area and chip wiring and can undesirably increase power dissipation.

Due to the design tradeoffs regarding chip area, chip wiring, and power dissipation, some prior integrated circuit chips limit the number of spare memory array instances incorporated within the design. If the number of included spare memory array instances proves insufficient to compensate for the number of detected defect(s) and/or failure(s), the integrated circuit chip may resort to masking off (i.e., making unusable) portions of, or even entire memory array instances. The present application appreciates that, while this solution can be effective in some applications that do not require high-performance and high memory bandwidth, masking off memory arrays or portions thereof can result in an unacceptable reduction in storage capacity and/or integrated circuit chip performance.

In summary, memory array sparing has been used effectively to increase manufacturing yields and to enhance reliability of integrated circuit chips. Maintaining and/or improving either of these metrics is an increasing challenge as technology evolves to support ever increasing memory densities and ever decreasing line sizes, both of which makes integrated circuit designs more susceptible to manufacturing defects and reliability problems.

BRIEF SUMMARY

In view of the foregoing, the present application recognizes that it would be useful and desirable to support acceptable manufacturing yields and reliability of integrated circuit chips by improved memory array sparing. In at least some embodiments, the improved memory array sparing includes increasing the number of spare replacement events supported through enabling partial array sparing.

In at least some embodiments, an integrated circuit chip includes a plurality of memory arrays, where each memory array among the plurality of memory arrays includes multiple partial memory arrays. In some embodiments, the integrated circuit chip can be configured to assign partial memory arrays to a first pool of in-service partial memory arrays, a second pool of spare (or redundant) partial memory arrays, or a third pool of out-of-service partial memory arrays. In some embodiments, a partial memory array in the first pool in which a defect or failure is detected can be replaced with a partial memory array in the second pool. In at least some cases, following a replacement event, the integrated circuit chip can assign the replaced partial memory array to the third pool.

In at least some embodiments, the integrated circuit chip includes first, second, and third memory arrays each including multiple partial memory arrays. The integrated circuit chip can be configured to replace a partial memory array of the first memory array with one partial memory array of the third memory array and to replace a partial memory array of the second memory array with a different partial memory array of the third memory array.

In one or more embodiments, an integrated circuit includes a semiconductor substrate and integrated circuitry on the semiconductor substrate. The integrated circuitry includes a memory array including a plurality of memory macros including at least first and second memory macros. Each of the plurality of memory macros includes multiple partial arrays and a shared macro controller configured to control read and write access to the multiple partial arrays. The memory array also includes spare access control logic configured to direct an access to a first partial array in the first memory macro to a second partial array in the second memory macro. Supporting partial array sparing increases the maximum number of sparing events without requiring a larger number of spare memory arrays.

In one or more embodiments, the plurality of memory macros includes a third memory macro and the spare access control logic is configured to direct an access to a third partial array in the third memory macro to a fourth partial array in the second memory macro. By permitting spare partial arrays in the same memory macro to be utilized as spares for different memory macros, a greater number of sparing events can be supported.

In one or more embodiments, the integrated circuit can further include an array built-in self-test (ABIST) circuit configured to replace the first partial array with the second partial array. The ABIST circuit thus enables hardware-controlled partial array sparing.

In one or more embodiments, the integrated circuit includes at least one configuration register. The ABIST circuit replaces the first partial array with the second partial array by updating the at least one configuration register. The configuration register provides a facility in the integrated circuit that controls partial array sparing.

In one or more embodiments, the access to the memory array is read access, and read data is returned on a read data return bus of the memory array. The first partial array is assigned a particular data beat among a plurality of data beats on the read data return bus. The spare access control logic is configured to cause the second partial array, which replaced the first partial array, to drive read data on the read data return bus during the particular data beat initially assigned to the first partial array. The technique of partial array sparing thus maintains the access timing prior to the replacement of the first partial array.

In one or more embodiments, each of the plurality of memory macros includes a row address decoder shared by the multiple partial arrays. Sharing of the row address decoder by the partial arrays of the second memory macro reduces integrated circuit floorplan area utilized to support array sparing.

In one or more embodiments, the memory array comprises an embedded static random access memory (SRAM). SRAM memory arrays provide high performance storage and can be fabricated utilizing known techniques.

In some embodiments, a design structure is tangibly embodied in a machine-readable storage device for designing, manufacturing, or testing an integrated circuit. The design structure comprises an integrated circuit, including a semiconductor substrate and integrated circuitry on the semiconductor substrate. The integrated circuitry includes a memory array including a plurality of memory macros including at least first and second memory macros. Each of the plurality of memory macros includes multiple partial arrays and a shared macro controller configured to control read and write access to the multiple partial arrays. The memory array also includes spare access control logic configured to direct an access to a first partial array in the first memory macro to a second partial array in the second memory macro. Supporting partial array sparing increases the maximum number of sparing events without requiring a larger number of spare memory arrays.

In one or more embodiments, a method of operating a memory array includes replacing, in a memory array including a plurality of memory macros including at least first and second memory macros, wherein each of the plurality of memory macros includes multiple partial arrays and a shared macro controller configured to control read and write access to the multiple partial arrays, the first partial array in the first memory macro with a second partial array in the second memory macro in a partial sparing event. Thereafter, a spare access control circuit in the memory array directs an access to the first partial array in the first memory macro to the second partial array in the second memory macro.

DETAILED DESCRIPTION

Figure 1:
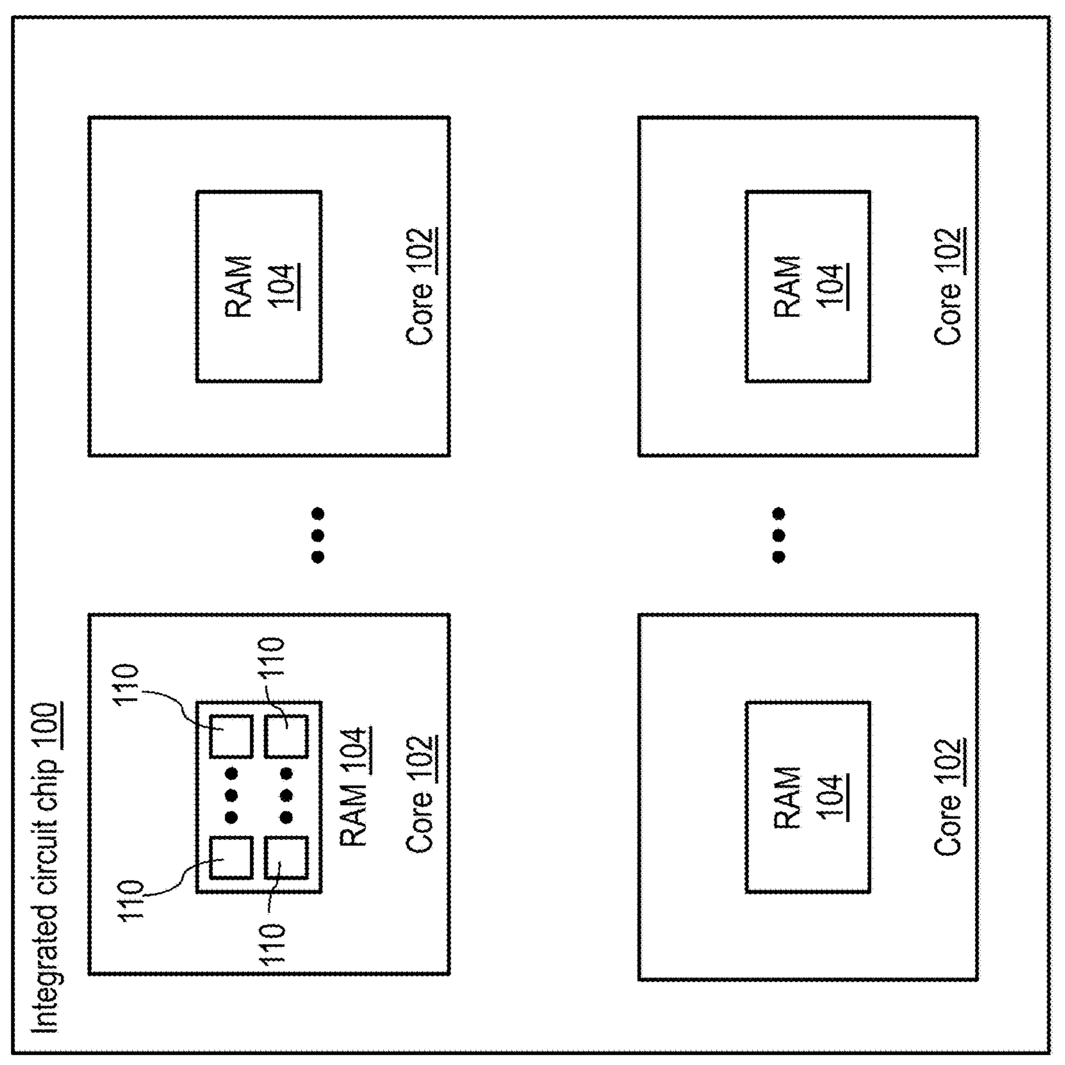
FIG. 1 is a high-level block diagram of an exemplary integrated circuit chip in accordance with one or more embodiments.

With reference to the figures and with particular reference to FIG. 1, there is illustrated a high-level block diagram of an exemplary integrated circuit chip 100 in accordance with one embodiment. Integrated circuit chip 100 comprises a semiconductor substrate on which integrated circuit can be fabricated in a manner that is currently known or developed in the future. In the illustrated example, integrated circuit chip 100 is configured as a processor including a plurality of cores 102 (e.g., 2, 4, 8, 12, 16, 20, 32, etc.) for processing data and instructions in accordance with a selected instruction set architecture (e.g., z/Architecture, POWER, RISC5, ARM, Graphics Processing Unit (GPU) architecture, Apple silicon, x86, etc.). In this example, each core 102 includes an embedded random access memory (RAM) 104 (e.g., a static random access memory (SRAM)) providing high performance (i.e., low access latency) storage for data and/or instructions processed by that core 102. For example, RAM 104 may serve as an instruction cache, data cache, unified cache, translation cache, or other storage component supporting execution of core 102.

In the depicted embodiment, each RAM 104 includes a plurality of independently controllable RAM macros (arrays) 110. In preferred embodiments, integrated circuit chip 100 is configured to initially place in a first subset (or pool) certain RAM macros 110 that are in-service and to initially reserve in a second subset (or pool) other RAM macros 110 designated as spare(s) that can be substituted in place of failing or failed in-service RAM macro(s) 110, as described in detail herein. In at least some use cases or embodiments, processor 100 can place in a third subset (or pool) any RAM macros 110 or portions thereof that are replaced by a spare, where RAM macros 110 or portions thereof placed in the third subset are withdrawn from further use. Those skilled in the art will appreciate that in some embodiments, one or more of RAMs 104 and/or RAM macros 110 may be implemented within a processor chip but outside of a core 102, or may be implemented within a different type or class of integrated circuit chip 100.

Figure 2:
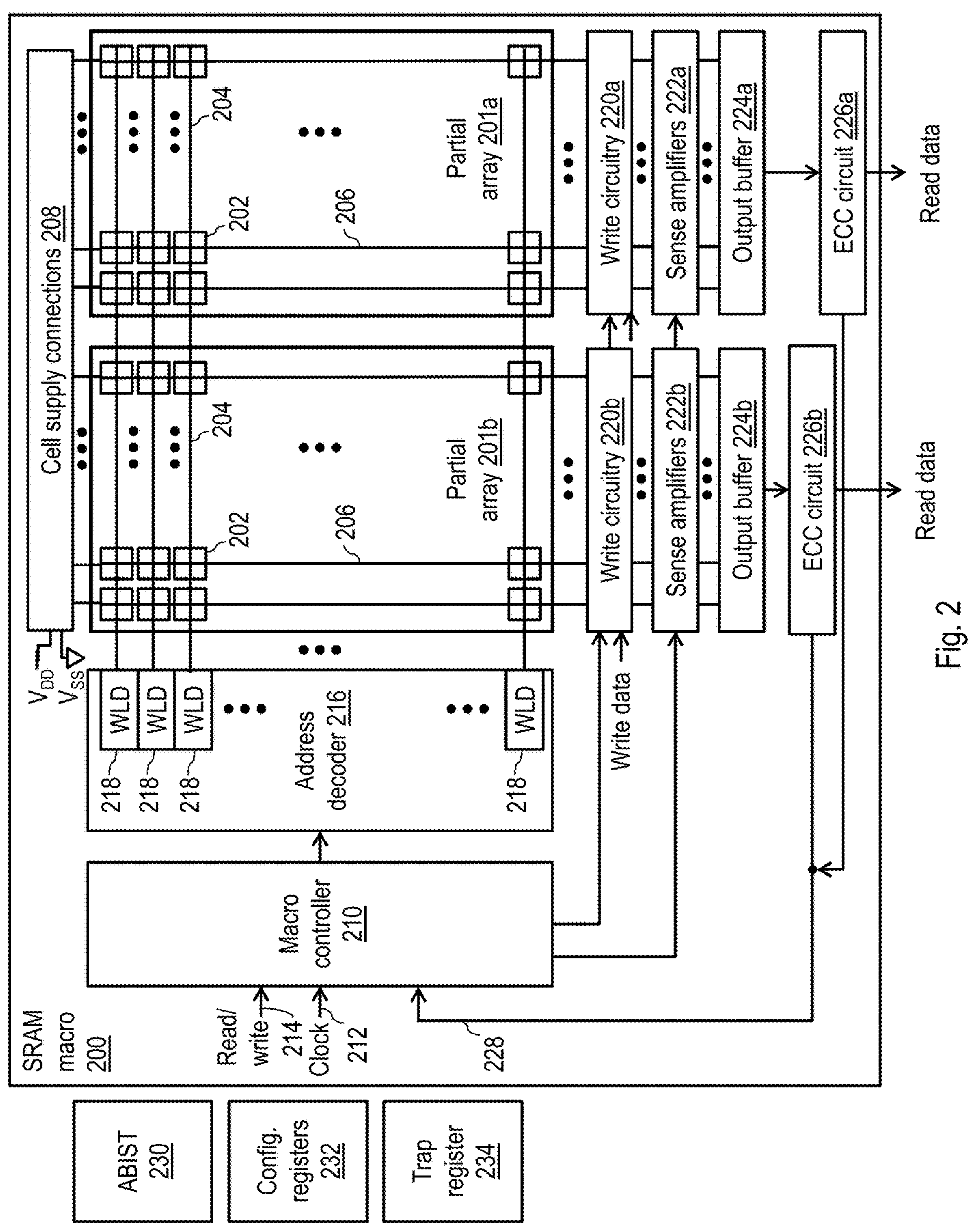
FIG. 2 is a more detailed block diagram of an exemplary embodiment of a random access memory (RAM) macro including spare partial arrays (subarrays) that can be implemented within the integrated circuit of FIG. 1 in accordance with one or more embodiments.

With reference now to FIG. 2, there is illustrated a more detailed block diagram of an exemplary embodiment of a static random access memory (SRAM) macro 200 that can be utilized to implement any one of RAM macros 110 in integrated circuit chip 100 of FIG. 1. In other embodiments, RAM 110 may be implemented with an alternative memory technology, such as resistive RAM (ReRAM) or magnetoresistive RAM (MRAM).

In accordance with one aspect of the disclosed inventions, SRAM macro 200 includes multiple partial arrays 201. In some embodiments, the number of partial arrays 201 can be a positive integer power of 2, e.g., 2, 4, 8, etc. In other embodiments, the number of partial arrays 201 can be other than a positive integer power of 2, e.g., 3, 5, 6, etc. In the illustrated embodiment, SRAM macro 200 includes two partial arrays 201*a*, 201*b*. In accordance with one aspect of the disclosed inventions, each partial array 201 of SRAM macro 200 can be separately and independently placed in-service to store data and separately and independently taken out of service and replaced by a spare partial array 201 of a like SRAM macro 200.

As will be appreciated, in designing a RAM 104 of a given nominal storage capacity, the number of partial arrays 201 implemented in each SRAM macro 200 and the total number of SRAM macros 200 initially provisioned as "spares" are design choices dependent upon a number of factors, including the available chip floorplan area, physical layout constraints, wiring budget, timing considerations, and the desired maximum number of sparing events supported by the design. In this context, a "sparing event" refers to the replacement of an in-service partial array 201 of a given RAM 104 with a partial array 201 of a spare SRAM macro 200 of the given RAM 104. The maximum number of sparing events thus refers to the largest number of partial array replacement events that can occur in the RAM 104 before the storage capacity of the RAM 104 is degraded. A technical advantage of the disclosed inventions is that by enabling each in-service partial array 201 to be separately and independently replaced by a spare, the maximum number of sparing events for a given design can be increased without substantially increasing the chip floorplan area dedicated to spare SRAM macros 200. Referring specifically to the embodiment of FIG. 2, if, for example, partial array 201*a* of SRAM macro 200 contained a process defect not affecting partial array 201*b*, partial array 201*a* could be replaced in a first sparing event (by a partial array 201 of another spare SRAM macro 200), while retaining partial array 201*b* of SRAM macro 200 in-service. This partial sparing capability would leave the other partial array 201 of the spare SRAM macro 200 available for use in a second sparing event. Thus, the number of sparing events supported by a given design can increase with the number of partial arrays 201 that are implemented in each SRAM macro 200, but without increasing the overall number of SRAM macros 200 in RAM 104.

Still referring to FIG. 2, each partial array 201 includes a multiplicity of individual memory cells 202. Memory cells 202 are physically arranged in a matrix including a plurality of rows (e.g., M rows), each accessed via a respective wordline 204, and a plurality of columns (e.g., N columns), each accessed via respective bitline(s) 206 (generally, a pair of bitlines, including a bitline true (BLT) and a bitline complement (BLC)). If implemented in a conventional manner (i.e., as a 6T cell), each memory cell 202 includes a pair of cross-coupled inventers and two NMOS pass transistors connecting the inventers to a bitline pair (BLT and BLC), where the NMOS pass transistors are controlled by the relevant wordline 204. Memory cells 202 within partial arrays 201*a*, 201*b* are powered via cell supply connections 208 to an upper cell supply voltage rail having a nominal upper supply voltage $V_{DD}$ (e.g., 0.8 V) and a lower supply voltage rail having a nominal lower supply voltage $V_{SS}$ (e.g., ground).

SRAM macro 200 additionally includes a macro controller 210 having a first input that receives a reference clock signal 212 and a second input that that receives read/write access commands 214, each specifying a target address. In response to these inputs, macro controller 210 orchestrates read and write accesses to the relevant memory cells 202 within partial arrays 201*a*, 201*b*. In some embodiments, these accesses include, in addition to reads and writes of a full row of memory cells 202, a partial write to only a subset of the memory cells 202 comprising a row of memory cells 202. Macro controller 210 is coupled to an address decoder 216, to which macro controller 210 forwards the target address of each read or write command. Address decoder 216, which includes a wordline driver (WLD) 218 for each wordline 204, decodes the target address to identify a corresponding wordline 204. The wordline driver 218 for the identified wordline 204 then asserts its corresponding wordline 204 to access memory cells 202 in the associated row of SRAM macro 200. For a write command, macro controller 210 also controls write circuitry 220*a* or 220*b* to apply write data received in conjunction with the write command to the relevant bit lines 206, thus updating the accessed memory cells 202. For a read command, assertion of the selected wordline 204 causes the bits stored in the memory cells 202 coupled to that wordline 204 to be read out onto bitlines 206, detected by sense amplifiers 222*a*, 222*b*, and buffered in output buffers 224*a*, 224*b*.

In at least some embodiments, the output data are passed to an error correcting code (ECC) circuit 226*a* or 226*b*, which detects, and if possible, corrects, errors in the output data. The corrected output data are returned to a requestor as read data. ECC circuits 226*a* and 226*b* additionally report, via signal line 228, any correctable errors (CEs) and uncorrectable errors (UEs) detected in the output data to macro controller 210. For CEs, ECC circuits 226*a* and 226*b* may optionally provide the corrected data to write circuitry 220*a* or 220*b* as write data in order to enable the corrected data to be written back into one of partial arrays 201, 201*b*. Those skilled in the art will appreciate that in some alternative embodiments the ECC circuits of RAM 104 may be implemented external to SRAM macros 200 in order to provide more robust error correction capabilities.

In a typical implementation, an integrated circuit 100 will also include one or more instances of array built-in self-test (ABIST) circuit 230 for testing one or more SRAM macros 200 for defects and/or failures. In addition, a typical implementation of integrated circuit 100 will include one or more sets of configuration registers 232, which, among other things, identify the status of each partial array 201 as an in-service partial array in the first pool, a valid spare partial array in the second pool, or a defective partial array in the third pool. In response to detection of a defect or failure in one of partial arrays 201, ABIST circuit 230 and/or macro controller(s) 210 may update configuration registers 232.

During regular operation, macro controller 210 may further record any CEs or UEs within partial arrays 201*a*, 201*b* in a trap register 234.

As noted above, in some implementations, the disclosed arrangement can be utilized to implement a cache memory, such as one of the set-associative cache memories commonly used to provide storage for data, instructions, and/or translations accessed by a core 102. For example, an 8-way set-associative cache can be formed utilizing a pool of in-service partial arrays 201 (and another pool of spare partial arrays 201), where data for a first group of the 8 sets (e.g., sets 0-3) can be stored across partial arrays 201*a* of the SRAM macros 200 and data for a second group of sets (e.g., sets 4-7) can be stored across partial arrays 201*b* of the SRAM macros 200. Of course, the assignment of groups of sets to partial arrays 201 can vary between differing cache designs having differing set-associativity and/or differing numbers of partial arrays 201. In one specific example, partial arrays 201 each include 1024 rows and 288 columns of memory cells 202, providing storage in the row of each partial array 201 for four sets of 72-bits each (e.g., 8 bytes of data plus 8 bits of ECC).

In the embodiment of FIG. 2, each partial array 201 has its own respective write drivers (in write circuitry 220), sense amplifiers 222, and output buffer 224. However, as should be appreciated upon reference to the foregoing, in accordance with the disclosed inventions, unlike independent arrays, partial arrays 201*a*, 201*b* share substantial common control circuitry. In the depicted example, this common control circuitry includes address decoder 216 and its associated wordline drivers 218. In addition, the common control circuitry includes macro controller 210, which includes clock control circuitry, access sequencing circuitry, sense amplifier control circuitry for controlling sense amplifiers 222*a*, 222*b*, and write driver control circuitry for controlling write circuitry 220*a*, 220*b*. The common control circuitry also includes a common write column decoder (not explicitly illustrated in FIG. 2).

As a tradeoff for the increased maximum number of sparing events that can be supported by a given number of spare arrays through the partial array sparing enabled by the disclosed inventions, a RAM macro will have concomitant restrictions on the degree of independence of the operation of its constituent partial arrays. In the exemplary design of FIG. 2, these restrictions are due to the use of shared clocking logic, a shared macro controller 210, and a shared address decoder 216 for both of partial arrays 201*a*, 201*b*. For example, in some embodiments of SRAM macro 200, either of partial arrays 201*a*, 201*b* can be accessed by a read operation or write operation while the other partial array 201 remains idle for the duration of the access. Thus, for example, if SRAM macro 200 has a 4-cycle access latency, initiating an access to partial array 201*a* while partial array 201*b* remains idle would mean that partial array 201*b* would not be available to access for 4 cycles. Further, in at least some embodiments of SRAM macro 200, partial arrays 201*a*, 201*b* can be accessed concurrently by the same type of access (read or write) if the accesses are initiated at the same cycle and access the same wordline 204. If the concurrent accesses are read operations, the Set ID or way (hereafter, referred to as Set ID), which identifies the columns of bits accessed, can be different between partial arrays 201*a*, 201*b*; however, concurrent write operations are further restricted to updating the same columns of bits in both of partial arrays 201*a*, 201*b*. Those skilled in the art will appreciate that differing cache designs may choose a greater or lesser degree of dependence/independence between partial arrays. In general, greater independence between partial arrays can be achieved at the additional cost of more complex SRAM design and less savings in chip area attributable to shared control circuitry. This additional cost can be weighed against the loss of repairability due to restricted replacement rules and/or the additional area cost of full SRAM macro spares.

Figure 3:
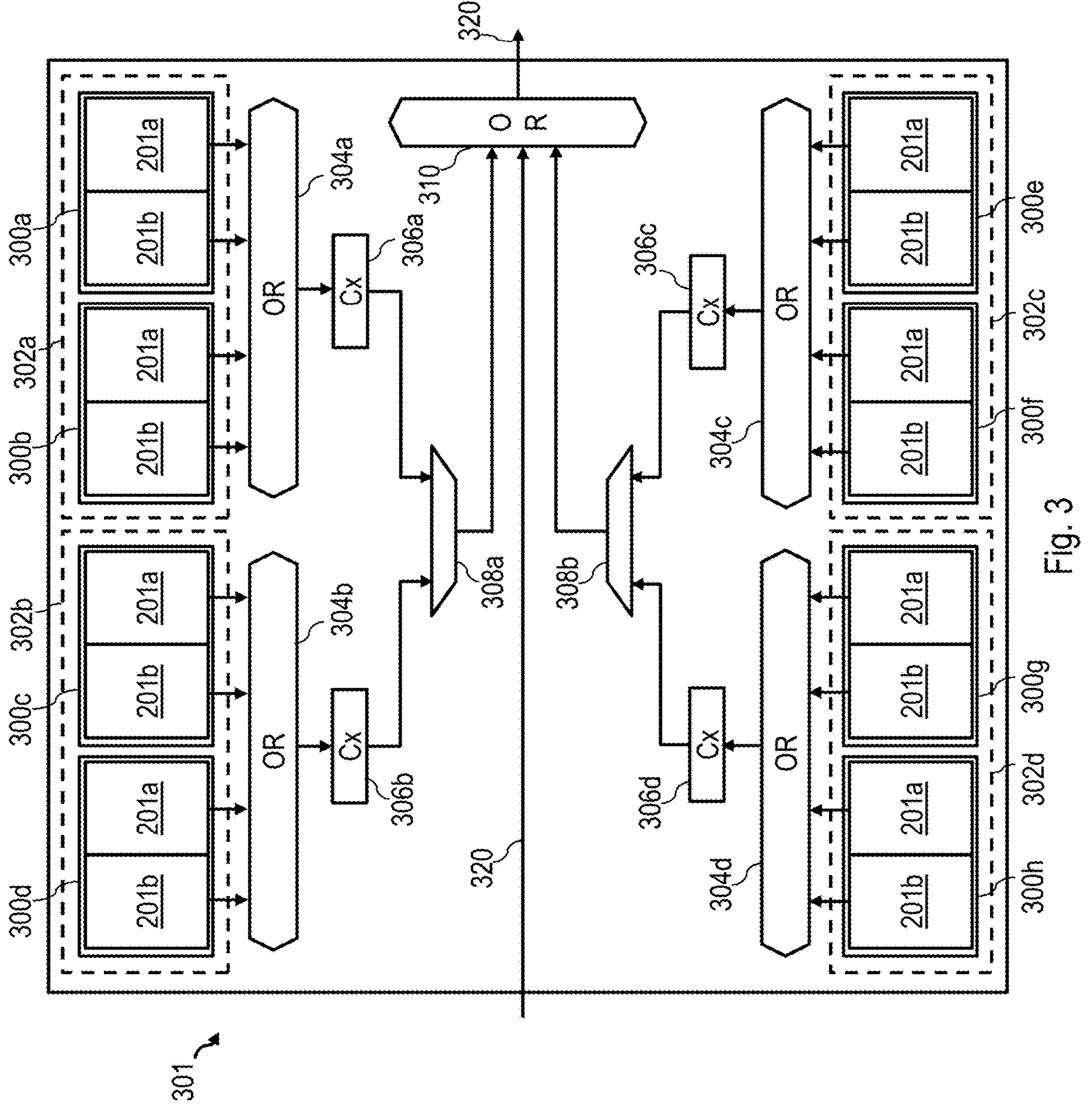
FIG. 3 illustrates a portion of an exemplary cache memory in accordance with one or more embodiments, where the illustrated portion of the cache memory includes multiple RAM macros to provide storage for doublewords of data.

With reference now to FIG. 3, there is provided a simplified illustration of a cache slice 301 of an exemplary cache memory in accordance with one or more embodiments. The cache memory is one example of an embedded RAM 104.

In the example depicted in FIG. 3, cache slice 301 is one of eight cache slices together forming a 16-way set associative cache, where each of the eight cache slices 301 is configured to store a 8-byte doubleword of a 64-byte cache line. To provide the requisite storage, each cache slice 301 includes eight SRAM macros 300, including SRAM macros 300*a* to 300*h*. As merely one example, each of SRAM macros 300 can be implemented, for example, with an SRAM macro 200 including partial arrays 201*a* and 201*b* as described above with reference to FIG. 2. (Because the details of such embodiments are provided in FIG. 2, FIG. 3 omits explicit illustration of components of SRAM macros 300 other than partial arrays 201*a*, 201*b*.)

SRAM macros 300 are grouped in pairs, each forming a respective index range group 302. Thus, index range group 302*a* includes SRAM macros 300*a*, 300*b*, index range group 302*b* includes SRAM macros 300*c*, 300*d*, index range group 302*c* includes SRAM macros 300*e*, 300*f*, and index range group 302*d* includes SRAM macros 300*g*, 300*h*. Each of these index range groups 302 is selectable by a corresponding value of an index portion of a cache line address. For example, index range 0 selects index range group 302*a*, index range 1 selects index range group 302*b*, index range 2 selects index range group 302*c*, and index range 3 selects index range group 302*d*. Within an index range group 302, one SRAM macro 300 can be assigned to store a relevant portion of a cache line for half of the cache sets, and the other SRAM macro 300 can be assigned to store the same portion of a cache line for the other half of the cache sets. As one example, SRAM macros 300*a*, 300*c*, 300*e* and 300*g* can be utilized to store data for cache sets 0 to 7, and SRAM macros 300*b*, 300*d*, 300*f* and 300*h* can be utilized to store data for cache sets 8 to 15 of a 16-way set associative cache.

FIG. 3 is additionally simplified to illustrate the read data path of cache slice 301 rather than both the read and write data paths. In this exemplary embodiment, cache slice 301 includes a respective OR gate 304 coupled to the partial arrays 201 of the SRAM macros 300 forming each index range group 302. For example, OR gate 304*a* is coupled to the partial arrays 201 of SRAM arrays 300*a*, 300*b*, OR gate 304*b* is coupled to the partial arrays 201 of SRAM arrays 300*c*, 300*d*, OR gate 304*c* is coupled to the partial arrays 201 of SRAM arrays 300*e*, 300*f*, and OR gate 304*d* is coupled to the partial arrays 201 of SRAM arrays 300*g*, 300*h* . . . . Each OR gate 304 is sized to receive and forward a doubleword of data read from one of the partial arrays 201 of one of the SRAM macros 300 of the associated index range group 302. Each OR gate 304 is further coupled to a respective one of read data latches 306*a* to 306*d*, each of which is configured to latch a doubleword of data output by the associated one of OR gates 304*a* to 304*d*. In FIG. 3, read data latches 306 are labeled with a cycle designation (e.g., "Cx") indicating the cycle that read data latches 306 are activated by control logic to output data. Cache slice 301 additionally includes read data selection logic for selecting between the contents of read data latches 306 and in-bound doubleword data (from another cache slice 301) on doubleword read data bus 320. In the illustrated example, the read data selection logic includes two multiplexers 308*a*, 308*b* for selecting between the contents of a pair of read data latches 306 and an OR gate 310 that drives either the output of one of multiplexers 308 or the in-bound doubleword data on doubleword read data bus 320. The outputs of multiplexers 308*a* and 308*b* are selected based on which index range group is being accessed and also based on the respective access cycle assigned to slice 301.

Figure 4:
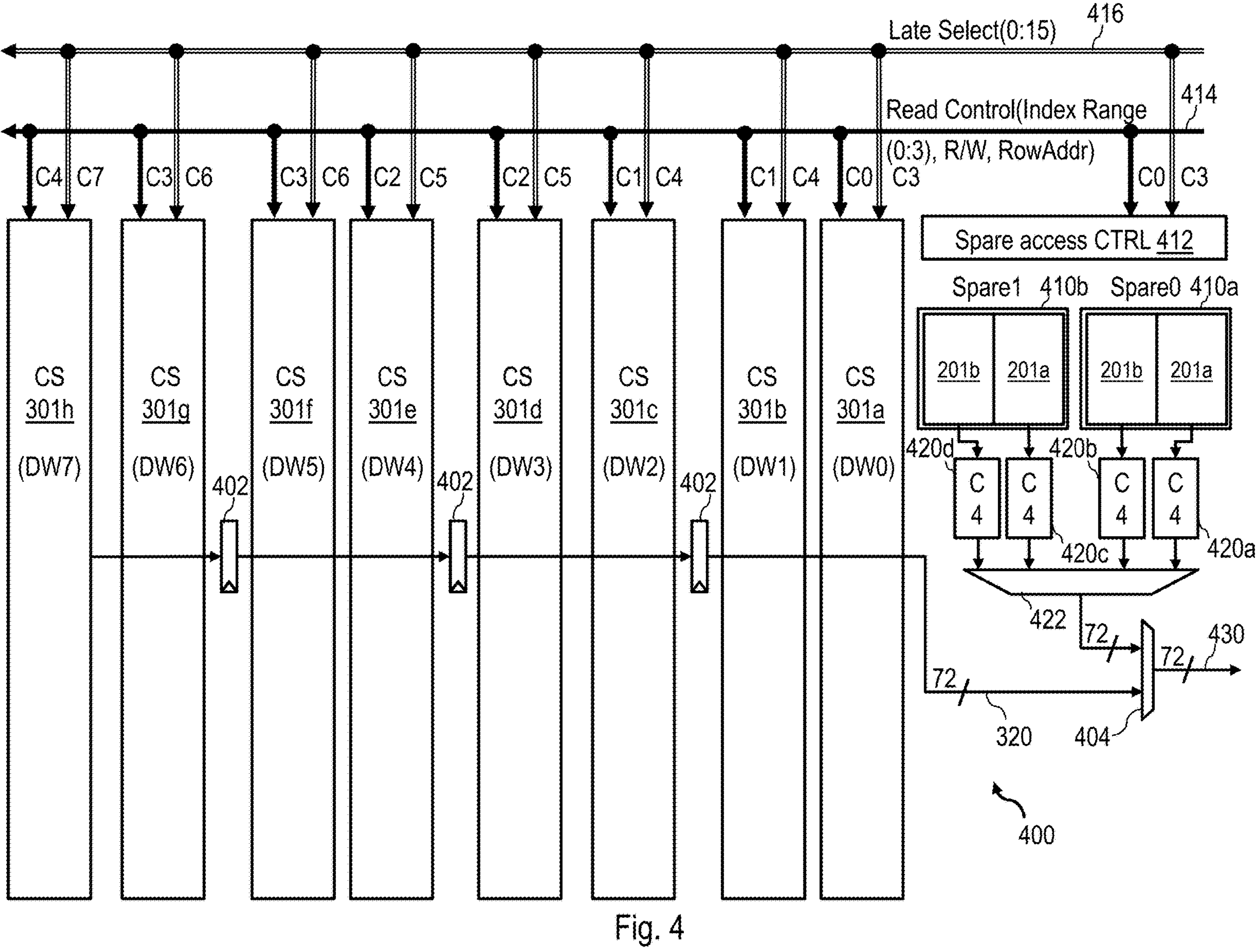
FIG. 4 depicts a view of an exemplary cache memory supporting partial array sparing in accordance with one or more embodiments, where the view illustrates the read data path.
Figure 7:
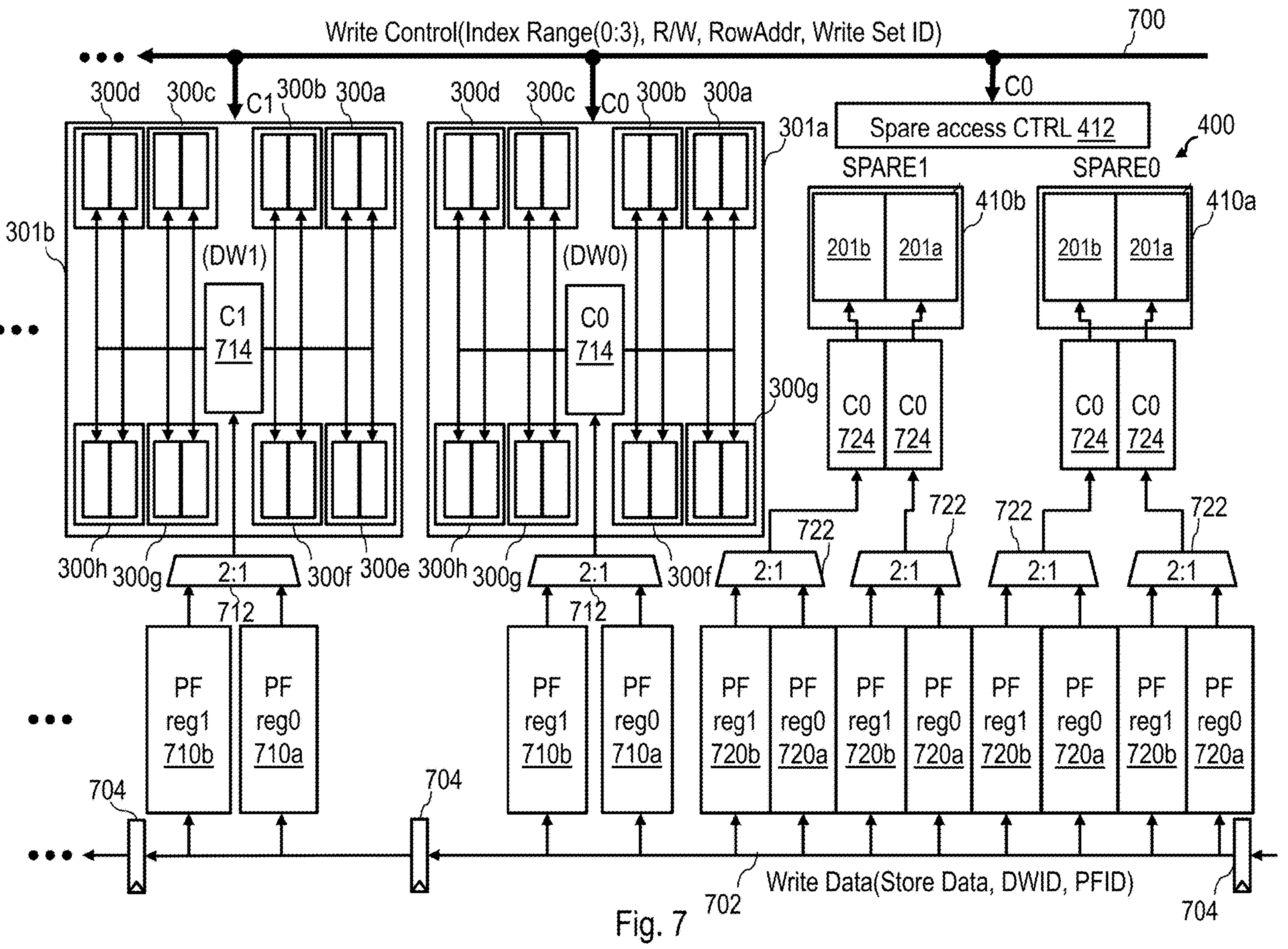
FIG. 7 illustrates a view of an exemplary cache memory supporting partial array sparing in accordance with one or more embodiments, where the view specifically depicts the write data path.

Referring now to FIG. 4, there is depicted a view of an exemplary cache memory 400 supporting partial array sparing in accordance with one or more embodiments. The view given in FIG. 4 specifically illustrates the read control and data paths, but for the sake of clarity omits the write control and data paths (a view of which is illustrated in FIG. 7).

In the illustrated example, cache memory 400 is a 16-way set associative cache memory formed of eight cache slices (CSs) 301*a* to 301*h*, as described in detail above with reference to FIG. 3. As indicated, cache slices 301*a* to 301*h* are respectively allocated to store data doublewords (DWs) DW0 to DW7, respectively, of 64-byte cache lines. The read data buses 320 of cache slices 301 are sequentially connected, with read data bus 320 of cache slice 301*h* coupled to an input of OR gate 310 of cache slice 301*g*, read data bus 320 of cache slice 301*g* coupled to an input of OR gate 310 of cache slice 301*f*, and so on. As indicated, one or more latches 402 may be interposed between the read data buses 320 of adjacent cache slices 301 as needed to satisfy timing constraints. The read data bus 320 of cache slice 301*a* forms one input of read data multiplexer 404.

In accordance with the disclosed inventions, cache memory 400 additionally includes a selected number of spare SRAM macros 410 (e.g., SRAM macros 410*a*, 410*b* labeled Spare0 and Spare1, respectively), which each can be implemented, for example, by an SRAM macro 200 as depicted in FIG. 2 and as described above. To avoid obscuring the relevant details of cache memory 400, only the partial arrays 201*a*, 201*b* of each SRAM macro 410 are explicitly illustrated in FIG. 4. It will be appreciated that in different embodiments differing numbers of spare SRAM macros 410 can be implemented, depending, for example, on the number of partial arrays in each spare SRAM macro 410, the desired maximum number of sparing events supported by cache memory 400, and the available chip floorplan area within integrated circuit chip 100. In the illustrated example, the inclusion of two spare SRAM macros 410*a*, 410*b* each including two partial arrays 201*a*, 201*b* enables cache memory 400 to have a maximum of four sparing events for the 128 partial arrays within cache slices 301*a* to 301*h*. In the illustrated case, each of the spare partial arrays 201 in SRAM macros 401*a*, 410*b* can be deployed as a spare in place of any of the partial arrays within cache slices 301*a* to 301*h*.

Cache memory 400 further includes spare access control logic 412, which controls the output of read data from spare partial arrays 201*a*, 201*b* of SRAM macros 410*a*, 410*b* in response to Read Control signal 414 and Late Select signal 416. One example of suitable spare access control logic 412 is described below with reference to FIGS. 5 and 8. In the embodiment given in FIG. 4, Read Control signal 414 includes a 4-bit Index Range to select a particular index range group 302, a 1-bit read/write (R/W) access type indication, and a 10-bit RowAddr to select a particular row among the 1024 rows of cache memory 400. In the illustrated embodiment, Late Select signal 416 is a one-hot 16-bit vector that selects one of the 16 Set IDs contained in SRAMs in the accessed index range group 302. The doublewords of data read out from the four partial arrays 201 of SRAM macros 410*a*, 410*b* are buffered in respective latches 420*a* to 420*d* and presented to multiplexer 422 for selection by Late Select signal 416. The output of multiplexer 422 forms a second input of read data multiplexer 404, which drives read data return bus 430.

FIG. 4 further illustrates exemplary sequencing of Read Control signal 414 and Late Select signal 416 in accordance with one embodiment. In this example, in which the access latency of each partial array 201 is 4 cycles, Read Control signal 414 initiates the access to partial arrays 201 of SRAM macros 410*a*, 410*b* and cache slice 301*a* in cycle 0 (C0), initiates access to partial arrays 201 of cache slices 301*b*, 301*c* in cycle 1 (C1), initiates access to partial arrays 201 of cache slices 301*d*, 301*e* in cycle 2 (C2), initiates access to partial arrays 201 of cache slices 301*f*, 301*g* in cycle 3 (C3), and initiates access to partial arrays 201 of cache slice 301*h* in cycle 4 (C4). Late Select signal 416 is similarly asserted sequentially to select the target Set ID within one of the various partial arrays 201. For example, in the depicted example, cache memory 400 asserts Late Select signal 416 at cycle 3 (C3) at spare access control logic 412 and cache slice 301*a*, at cycle 4 (C4) at cache slices 301*b*, 301*c*, at cycle 5 (C5) at cache slices 301*d*, 301*e*, at cycle 6 (C6) at cache slices 301*f*, 301*g*, and at cycle 7 at cache slice 301*h*. With this sequencing of Read Control signal 414 and Late Select signal 416, cache memory 400 returns a 64-byte cache line on read data return bus 430 one 8-byte doubleword at a time as set forth in Table 1 below.

TABLE 1

| Cycle | Doubleword |
|---|---|
| C4 | DW0 |
| C5 | DW1 |
| C6 | DW2 |
| C7 | DW3 |
| C8 | DW4 |
| C9 | DW5 |
| C10 | DW6 |
| C11 | DW7 |

Figure 5:
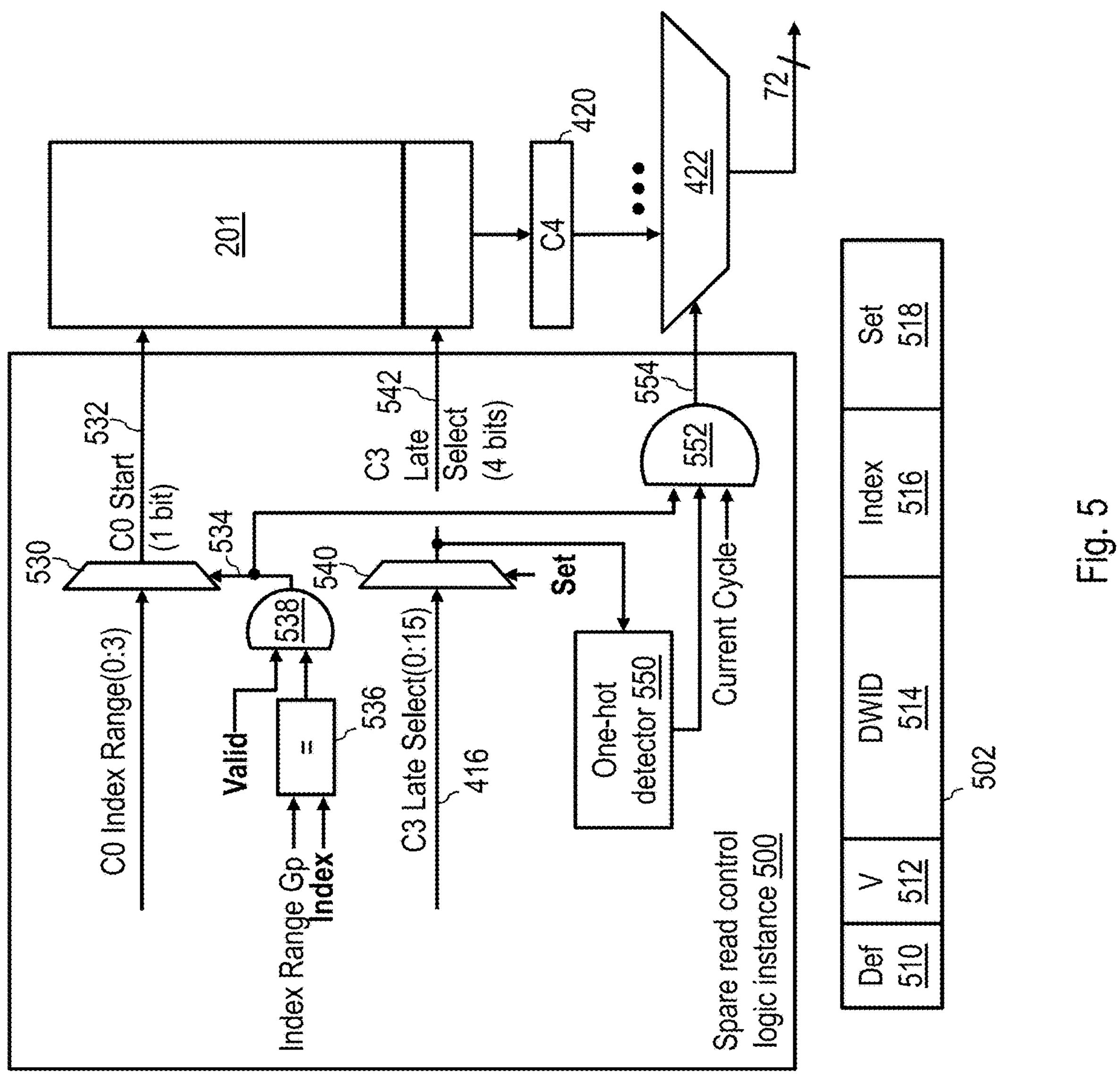
FIG. 5 illustrates exemplary spare read control logic for controlling reading of data from an in-service spare partial array in a cache memory in accordance with one or more embodiments.

With reference now to FIG. 5, there is illustrated exemplary spare read control logic for controlling reading of data from an in-service spare partial array in a cache memory in accordance with one or more embodiments. In particular, FIG. 5 provides an example of spare read control logic instance 500, where spare access control logic 412 of FIG. 4 can include one read control logic instance 500 for each partial array 201 among spare SRAM arrays 410.

In the illustrated embodiment, read control logic instance 500 logically combines components of Read Control signal 414 and Late Select signal 416 with various fields of a configuration register 502, which can be implemented as one of configuration registers 232 of FIG. 2. In the depicted example, configuration register 502 is uniquely associated with a particular spare partial array 201 and can be formatted as shown below in Table 2.

TABLE 2

| Bit(s) | Name | Description |
|---|---|---|
| 0 | Def | Defective partial array |
| 1 | Valid (V) | Spare partial array in use |
| 2:4 | DWID | DW Group of replaced partial array |

TABLE 2-continued

| Bit(s) | Name | Description |
|---|---|---|
| 5:6 | Index | Index Range Group of replaced partial array |
| 7:8 | Set | Set Range of replaced partial array |

Thus, in this example, configuration register 502 indicates by the state of Def field 510 whether or not the associated spare partial array 201 is defective (and therefore withdrawn from further use). In addition, configuration register 502 indicates by the state of Valid field 512 whether or not the associated spare partial array 201 is currently in-service (i.e., used for storing data of cache memory 400). If Valid field 512 is set to indicate the associated spare partial array 201 is in-service, configuration register 502 additionally indicates by DWID field 514, Index field 516, and Set field 518, respectively, the doubleword (e.g., D0 to D7), index range group 302, and set range (e.g., 0 to 3, 4 to 7, 8 to 11, or 12 to 15) of the replaced partial array.

In the particular embodiment given in FIG. 5, read control logic instance 500 includes a first multiplexer 530 that generates in cycle 0 (C0) a 1-bit Start signal 532 that initiates a read access to the associated partial memory array 201 based on the assertion of select signal 534. As represented logically by comparator 536 and AND gate 538, spare read control logic instance 500 asserts select signal 534 if the index range group specified in Index field 516 matches the index range indicated in Read Control signal 414 and Valid field 512 is asserted to indicated the associated spare partial array 201 is in-service.

The depicted embodiment of read control logic instance 500 additionally includes a second multiplexer 540 that, based on the set range identified in Set field 518, selects from the 16-bit Late Select signal 416 a 4-bit Late Select signal 542 asserted in cycle 3 (C3). Late Sect signal 542 causes the associated spare partial array to output the doubleword from the appropriate cache way of the associated spare partial array 201 to latch 420.

Spare read control logic instance 500 additionally generates a select signal 554 that selects the contents of one of latches 420 as an output of multiplexer 422. In the depicted example, spare read control logic instance 500 generates select signal 554 utilizing a one-hot detector 550 and an AND gate 552. Select signal 554 selects the doubleword output by the associated spare memory array 201 if the following logic yields a TRUE result:

Index Match AND Valid AND non-zero Late Select AND Current Cycle where (Index Match AND Valid) is provided by select signal 534, non-zero Late Select is generated by one-hot detector 550, and Current Cycle is asserted if the current clock cycle is equal to cycle 4 (C4) plus the doubleword identifier (e.g., 0 to 7) specified in DWID field 514. The dependency of select signal 554 on Current Cycle ensures that data read out of spare partial array 201 is driven on read data bus 320 in the same cycle initially assigned to the partial array replaced by spare partial array 201. It should be noted that the R/W and RowAddr components of Read Control signal 414 are not explicitly illustrated in FIG. 5 because these signal components are not affected by the processing performed by spare read control logic instance 500.

Figure 6:
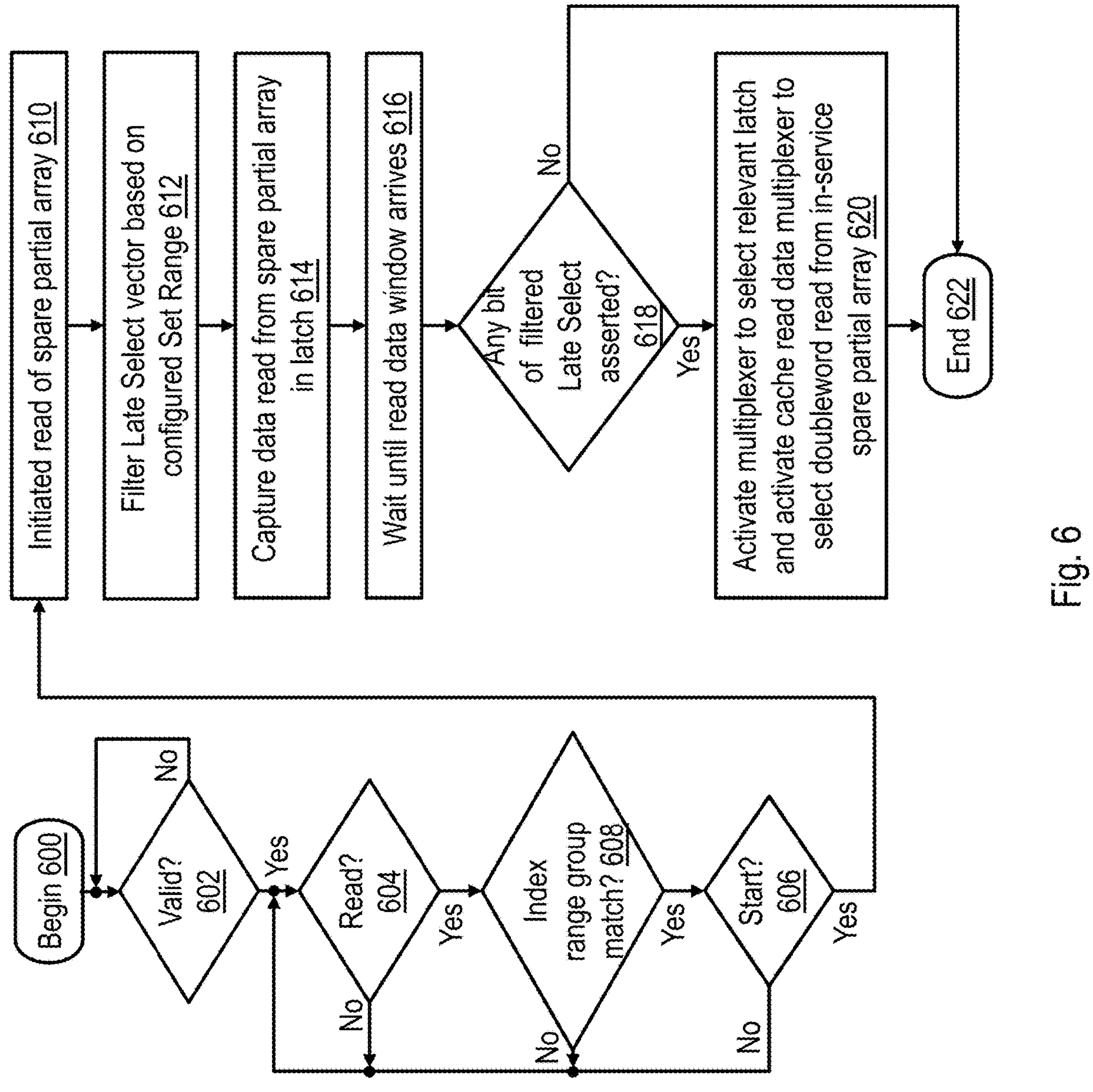
FIG. 6 is high-level logical flowchart of an exemplary method of reading data from an in-service spare partial array in accordance with one or more embodiments.

Referring now to FIG. 6, there is depicted a high-level logical flowchart of an exemplary method of reading data from an in-service spare partial array in accordance with one or more embodiments. To promote understanding, FIG. 6 is described below with reference to a cache memory 400 having spare SRAM macros 400 as depicted in FIGS. 4-5. It should be appreciated, however, that the process can be adapted for differing embodiments of a RAM.

The process of FIG. 6 begins at block 600 and then proceeds to block 602, which illustrates that the exemplary read process shown in FIG. 6 only operates on an in-service spare partial array 201 that has replaced a defective partial array through a partial array sparing event, as indicated by assertion of the Valid field 512 in the configuration register 502 associated with the in-service spare partial array 201. If the Valid field 512 of the associated configuration register 502 is not asserted, the process of FIG. 6 continues to iterate at block 602.

If Valid field 512 is asserted at block 602, the process of FIG. 6 proceeds to blocks 604 to 608, which illustrates spare read control logic instance 500 qualifying an access as applicable to the in-service spare partial array 201. For example, at block 604, spare read control logic instance 500 determines if the control signal for the access indicates a read access (e.g., with a R/W indication). If not, meaning the access is a write access as described below with reference to FIGS. 7-10, the process of FIG. 6 iterates at block 604. If, however, spare read control logic instance 500 determines at block 604 that the access is a read access, spare read control logic instance additionally 500 determines at block 608 whether or not the index range group identified in the Read Control signal 414 matches the Index field 516 of the configuration register 502 of the in-service spare partial array 201. In the embodiment of FIG. 5, spare read control logic instance 500 makes the determination depicted at block 608 utilizing comparator 536. In response to a negative determination at block 608, the process of FIG. 6 returns to block 604, which has been described. If, however, spare read control logic instance 500 detects an index range group match at block 608, spare read control logic instance 500 determines at block 608 whether to assert Start signal 532, for example, based on the receipt of the Index Range of Read Control signal 414 and assertion of select signal 534. In response to a negative determination at block 606, the process of FIG. 6 returns to block 604, which has been described. If, however, spare read control logic instance 500 makes an affirmative determination at block 606, the process proceeds to block 610.

At block 610, spare read control logic instance 500 initiates at read of the associated in-service spare partial array 201, for example, through assertion of Start signal 532. Spare read control logic instance 500 additionally filters Late Select signal 416, for example, utilizing second multiplexer 540, to generate an appropriate late select signal 542 that selects the relevant cache set from the in-service spare partial array 201 (block 612). The doubleword of data read from the selected cache set of the in-service spare partial array 201 is captured in a latch 420 (block 614).

The process then proceeds from block 614 to blocks 616-620, which collectively depict spare read control logic instance 500 utilizing one-hot detector 550 and AND gate 552 to selectively assert select signal 554 during the correct clock cycle relative to the initiation of the read access. As shown at block 616, spare read control logic instance 500 waits until the read data window (data beat) initially assigned to the replaced spare partial array 201 to assert select signal 554 to cause the doubleword of data read from the in-service spare partial array 201 to be output from multiplexer 422. Thus, for example, if in-service spare partial array 201 replaced a partial array providing storage for DW5, spare read control logic instance 500 waits to assert select signal 554 until cycle 9 (C9), as noted above in Table 2. Block 618 further illustrates one-hot detector 550 determining whether any bit of filtered Late Select signal 542 is asserted. If not, spare read control logic instance 500 does not assert select signal 554, and the process of FIG. 6 ends at block 622. If, however, one-hot detector 550 determines at block 618 that at least one bit of filtered Late Select signal 542 is asserted, AND gate 552 activates select signal 554 to select and output the doubleword of data in the associated latch 420 (block 620). In addition, cache memory 400 activates read data multiplexer 404 to select the doubleword read from the in-service spare partial array 201 and drive the doubleword on read data return bus 430. Following block 620, the process of FIG. 6 ends at block 622 until initiation of a next read operation of cache memory 400.

With reference now to FIG. 7, there is illustrated another view of an exemplary cache memory 400 supporting partial array sparing in accordance with one or more embodiments. The view given in FIG. 7 specifically depicts the write control and data paths, but for the sake of clarity omits the read control and data paths previously described with reference to FIG. 4.

In the embodiment of FIG. 7, cache memory 400 includes a write control signal 700. In this example, write control signal 700 specifies a 4-bit Index Range identifying one of index range groups 302, a 1-bit read/write (R/W) indication, a 10-bit RowAddr identifying a row address, and a 4-bit Set ID providing an encoded indication of one of the 16 cache sets (ways) to be written. Cache memory 400 additionally includes a write data bus 702 that communicates, in a write data packet, a doubleword of store data, a doubleword ID (DWID) identifying one of cache slices 301*a* to 301*h* (only cache slices 301*a* and 301*b* are specifically shown in FIG. 7 in order to permit more detailed illustration), and a platform register ID (PFID) identifying a platform register to buffer the doubleword of store data for the target cache slice 301 (or spare partial array 201). As indicated, one or more latches 704 may be interposed between segments of write data bus 702 as needed to satisfy timing constraints of the design.

Cache memory 400 is equipped with a selected number of platform registers 710 for staging store data to cache slices 301. For example, in the illustrated embodiment, each of cache slices 301*a* to 301*h* is supported by two platform registers, namely, PF reg0 710*a* and PF reg1 710*b*. The platform registers 710 supporting each cache slice 301 are coupled to inputs of a multiplexer 712 having an output coupled to respective store data latch 714. Store data latch 714 is coupled to the partial array 201 of each SRAM array 300 of the cache slice 301 in order to permit any partial array 201 of the cache slice 301 to be updated with the store data in store data latch 714.

In the illustrated embodiment in which each of the spare partial arrays 201 in spare SRAM macros 401*a*, 410*b* can be deployed as a spare in place of any of the partial arrays within cache slices 301*a* to 301*h*, each spare partial array 201 is similarly equipped with a number of platform registers 720 equal to the number of platform registers 710 supporting each cache slice 301. Thus, in the depicted example including four spare partial arrays 201, cache memory 400 includes four pairs of platform registers 720*a*, 720*b*. Each pair of platform registers 720 is coupled to inputs of a multiplexer 722 having an output coupled to respective store data latch 724. Each store data latch 724 is in turn coupled to a respective spare partial array 201 of one of SRAM arrays 410*a*, 410*b*.

Cache memory 400 further includes spare access control logic 412, which controls storing write data into spare partial arrays 201*a*, 201*b* of SRAM macros 410*a*, 410*b* in response to Write Control signal 700 and a Write Data packet on write data bus 702. One example of suitable spare write control logic is described below with reference to FIG. 8. FIG. 7 further indicates exemplary sequencing of Write Control signal 700 and store data in one embodiment. In this example, Write Control signal 700 initiates a store access to spare partial arrays 201 of SRAM macros 410*a*, 410*b* and cache slice 301*a* in cycle 0 (C0), initiates access to partial arrays 201 of cache slices 301*b*, 301*c* in cycle 1 (C1), initiates access to partial arrays 201 of cache slices 301*d*, 301*e* in cycle 2 (C2), initiates access to partial arrays 201 of cache slices 301*f*, 301*g* in cycle 3 (C3), and initiates access to partial arrays 201 of cache slice 301*h* in cycle 4 (C4). In the depicted example, cache memory 400 latches store data into the various store data latches 724 and 714 on the same cycles as Write Control signal 700 is asserted. With this sequencing, cache memory 400 can allocate or update a 64-byte cache line in four clock cycles. It should be noted that because spare SRAM arrays 410*a*, 410*b* are configured to receive read and write accesses concurrently with cache slice 301*a*, each of spare partial arrays 201*a*, 201*b* of SRAM arrays 410*a*, 410*b* can satisfy the timing of (and thus replace) any partial array of any cache slice 301.

Figure 8:
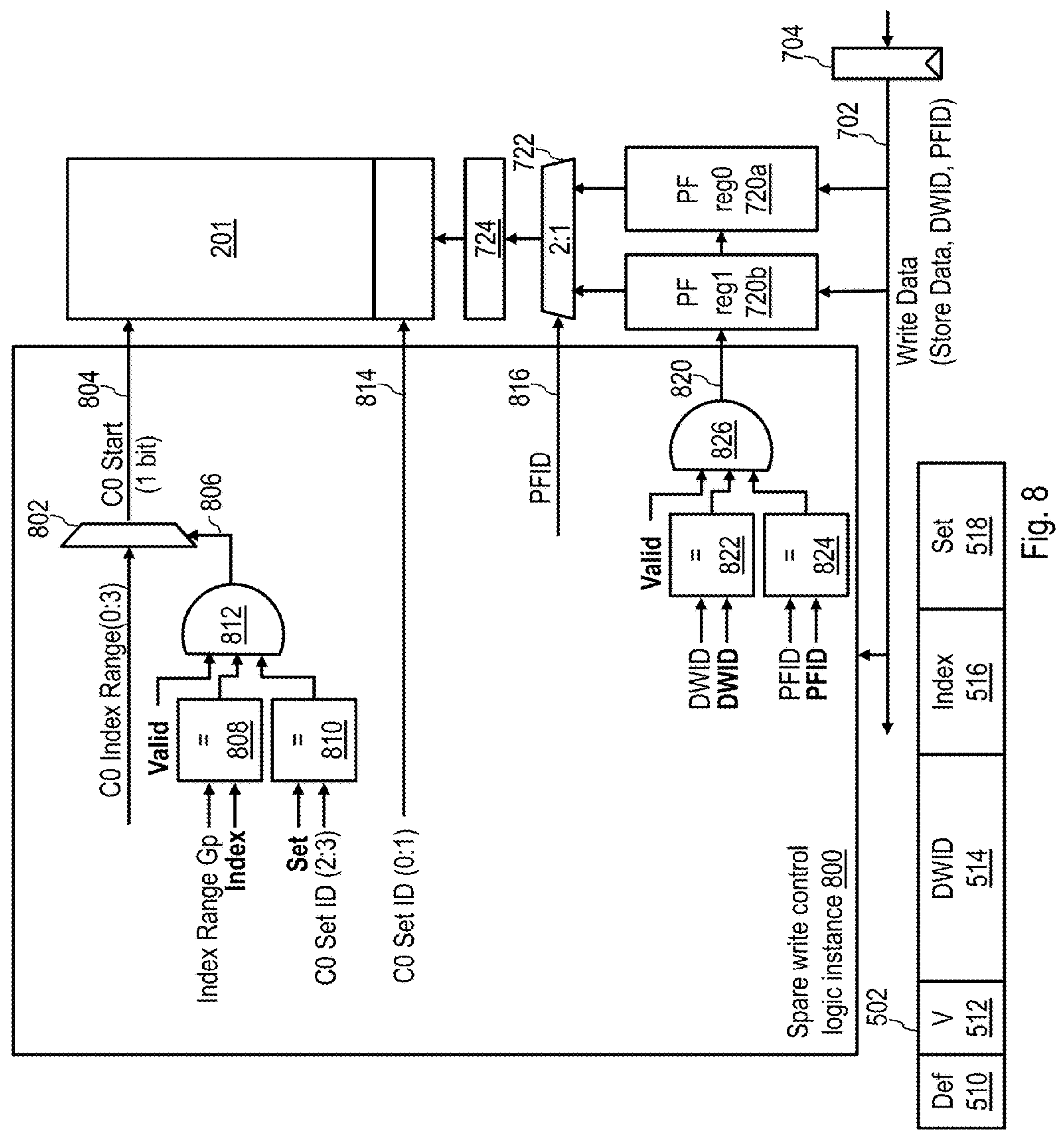
FIG. 8 depicts exemplary spare write control logic for controlling writing of data to an in-service spare partial array in a cache memory in accordance with one or more embodiments.

Referring now to FIG. 8, there is depicted an exemplary embodiment of spare write control logic for controlling writing of data into an in-service spare partial array in a cache memory in accordance with one or more embodiments. In particular, FIG. 8 provides an example of spare write control logic instance 800, where spare access control logic 730 of FIG. 7 can include one spare write control logic instance 800 for each partial array 201 of spare SRAM arrays 410.

In the illustrated embodiment, spare write control logic instance 800 logically combines components of Write Control signal 700 and Write Data packet with various fields of a configuration register 502 uniquely associated with the corresponding spare partial array 201. In the particular embodiment given in FIG. 8, spare write control logic instance 800 includes a multiplexer 802 that generates in cycle 0 (C0) a 1-bit Start signal 804 that initiates a store access to the associated spare partial array 201 based on the assertion of select signal 806. As represented logically by comparators 808, 810 and AND gate 812, spare write control logic instance 800 asserts select signal 806 if the index range group specified in Index field 516 matches the index range indicated in Write Control signal 700, the two higher order bits of Set ID (2:3) match the content of Set field 518, and Valid field 512 is asserted to indicate that the spare partial array 201 is in-service. The two lower order bits of Set ID (0:1) also form a select signal 814 that selects the cache set of spare partial array 201 to which the store data is directed.

Spare write control logic instance 800 also generates a select signal 816 that, in the cycle prior to one of platform registers 720 being loaded with store data, pre-selects one of platform registers 720*a*, 720*b* as an output of multiplexer 722. Spare write control logic instance 800 additionally generates an enable signal 820 that causes a selected one of platform registers 720*a*, 720*b* to be loaded with the doubleword of store data present in Write Data packet. In the depicted example, spare write control logic instance 800 generates enable signal 820 utilizing comparators 822 and 824 and AND gate 826 based on Valid field 510 and the DWID and PFID specified in the Write Data packet. Specifically, enable signal 820 is asserted if Valid field 512 is set and the comparator 822 determines the DWID in the Write Data packet matches DWID field 514 and comparator 824 determines the PFID in the Write Data packet matches the ID (0 or 1) of the relevant platform register 720*a* or 720*b*. It should again be noted that the R/W and RowAddr components of Write Control signal 700 are not explicitly illustrated in FIG. 8 because these signal components are not affected by the processing performed by spare write control logic instance 800.

Figure 9:
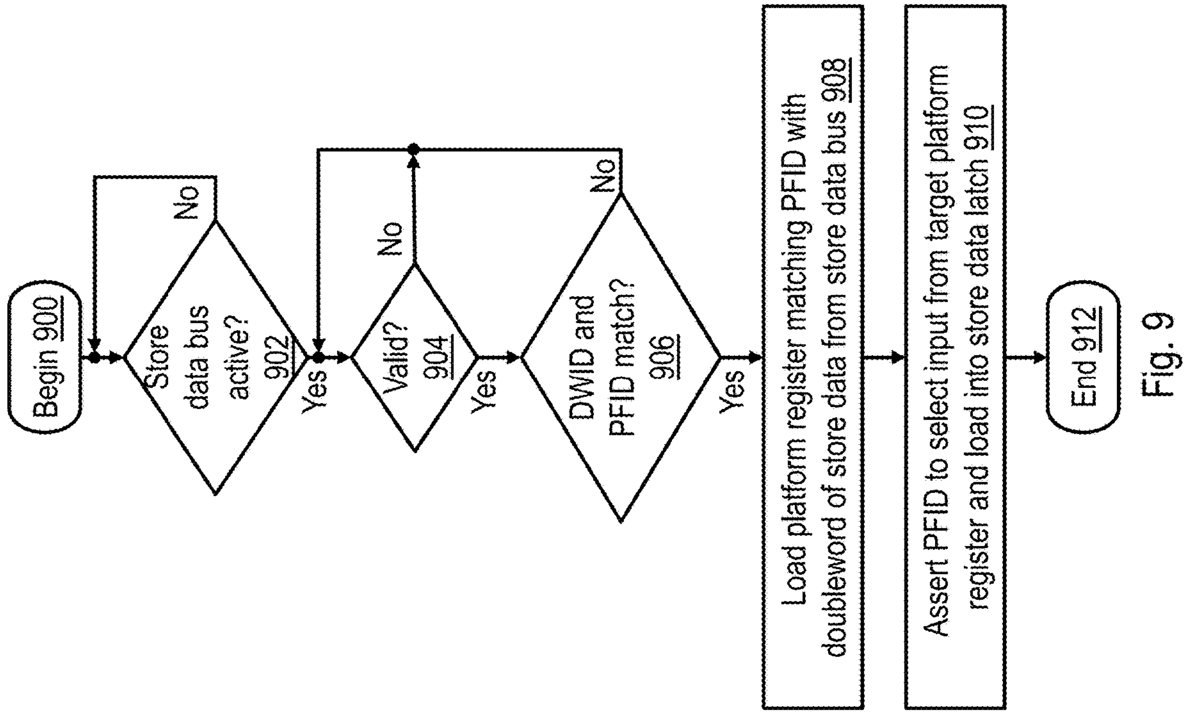
FIG. 9 is high-level logical flowchart of an exemplary method of loading a platform register of a cache memory with store data in accordance with one or more embodiments.
Figure 10:
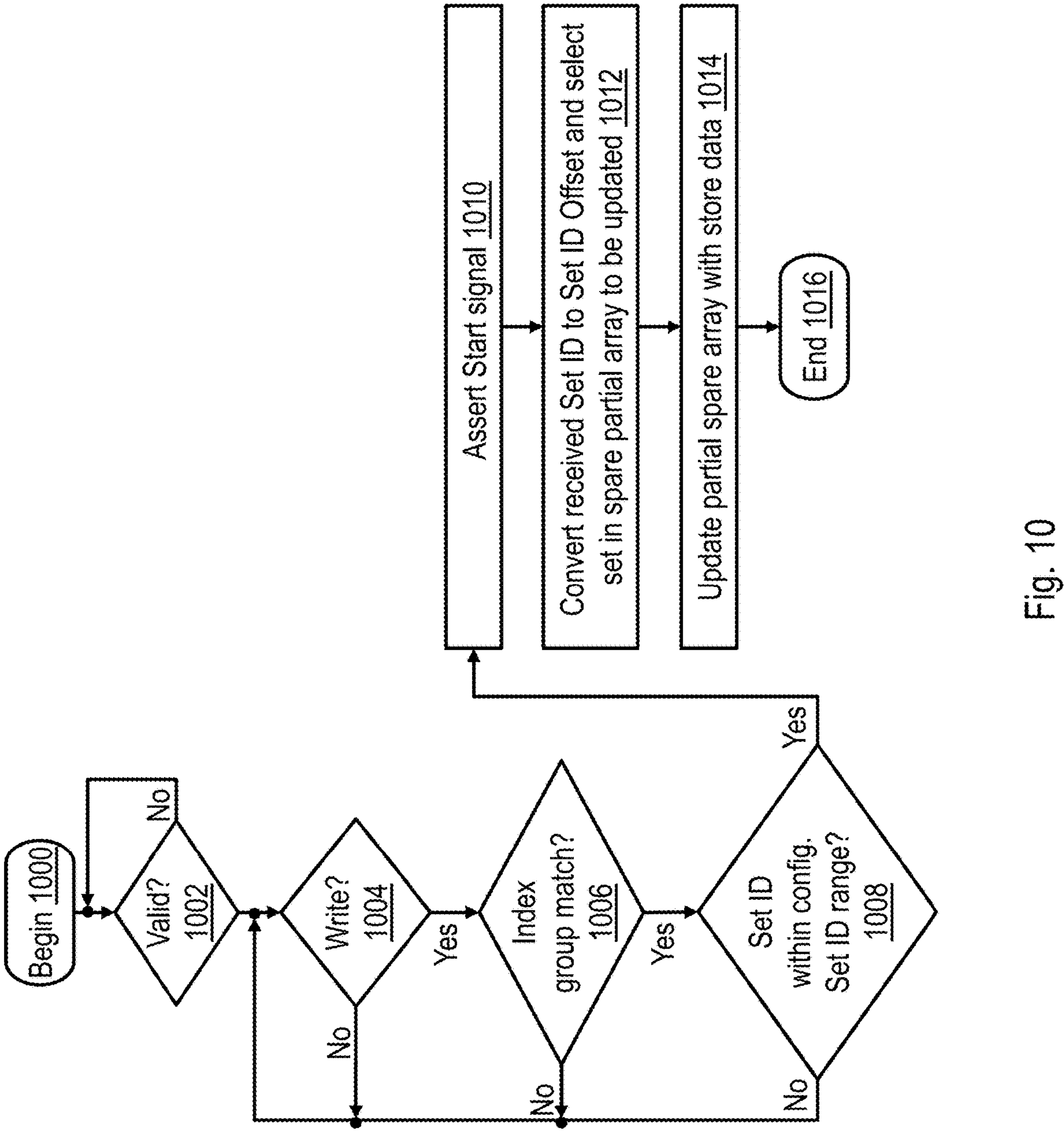
FIG. 10 is high-level logical flowchart of an exemplary method of storing data into an in-service spare partial array in accordance with one or more embodiments.

With reference now to FIGS. 9-10, an exemplary write operation to an in-service spare partial array is now described. To promote understanding, FIGS. 9-10 are described below with reference to a cache memory 400 as depicted in FIGS. 7 and 8. It should be appreciated, however, that the illustrated processes can be adapted for differing embodiments of a RAM.

Specifically referring to FIG. 9, there is illustrated a high-level logical flowchart of an exemplary method of loading a platform register of a cache memory with store data in accordance with one or more embodiments. The process of FIG. 9 begins at block 900 and then proceeds to block 902, which illustrates the process iterating until store data bus 702 becomes active. In response to detection that store data bus 702 is active, a spare write control logic instance 800 determines if the Valid field 512 of the configuration register 502 of associated spare partial array 201 is set to indicate the spare partial array 201 is in-service (block 904). In addition, the spare write control logic instance 800 determines whether the DWID in the Write Data packet on store data bus 702 matches DWID field 514 of configuration register 502 and the PFID in the Write Data packet matches the ID (e.g., 0 or 1) of the associated platform register 720*a* or 720*b*. In the embodiment of FIG. 8, the determinations illustrated at blocks 904 and 906 are made utilizing comparators 822, 824 and AND gate 826. In response to a negative determination at either block 904 or block 906, the process iterates at block 904. However, in response to affirmative determinations at both of blocks 904 and 906, spare write control logic instance 800 loads the platform register 720 matching the specified PFID with the doubleword of store data from the Write Data packet (block 908). Spare write control logic instance 800 additionally asserts the PFID as a select signal 816 to cause multiplexer 722 to forward data from the relevant platform register 720 to store data latch 724 (block 910). Following block 910, the process of FIG. 9 ends at block 912.

Referring now to FIG. 10, there depicted a high-level logical flowchart of an exemplary method of writing store data into an in-service spare partial array 201 in accordance with one or more embodiments. In the embodiment of spare write control logic instance 800 depicted in FIG. 8, spare write control logic instance 800 causes store data to be written into spare partial array 201 from store data latch 724 responsive to Start signal 804 and select signal 814.

The process of FIG. 10 begins at block 1000 and then proceeds to block 1002, which illustrates that the exemplary write process shown in FIG. 10 only operates on an in-service spare partial array 201 that has replaced a defective partial array through a sparing event, as indicated by assertion of the Valid field 512 of the associated configuration register 502. If the Valid field 512 of the associated configuration register 502 is not asserted, the process of FIG. 10 continues to iterate at block 1002.

If Valid field 512 is asserted at block 1002, the process of FIG. 10 proceeds to blocks 1004 to 1008, which collectively illustrate spare write control logic instance 800 qualifying an access to the in-service spare partial array 201, for example, utilizing comparators 808-810 and AND gate 812. At block 1004, spare write control logic instance 800 determines if the control signal for the access (e.g., the R/W indication) indicates a store access. If not, meaning the access is a read access as described above with reference to FIGS. 4-6, the process of FIG. 10 iterates at block 1004. If, however, spare write control logic instance 800 determines at block 1004 that the access indicated by the control signal is a store access, spare write control logic instance 800 additionally determines at block 1006 whether or not the index range group identified in Write Control signal 700 matches the Index field 516 of the configuration register 502 of the in-service spare partial array 201. In the embodiment of FIG. 8, spare write control logic instance 800 makes the determination depicted at block 1006 utilizing comparator 808. In response to a negative determination at block 1006, the process of FIG. 10 returns to block 1004, which has been described.

If, however, spare write control logic instance 800 detects an index range group match at block 1006, spare write control logic instance 800 additionally determines at block 1008 whether the store access targets the cache set group assigned to the in-service spare partial array 201. In the embodiment of FIG. 8, spare write control logic instance 800 makes the determination depicted at block 1008 utilizing comparator 810 to compare the two higher order bits of Write Set ID (2:3), which identify which of cache set groups 0 to 3, 4 to 7, 8 to 11, and 12 to 15 the store access targets, with the content of Set field 518 of the configuration register 502 associated with the in-service spare partial memory array 201. In response to a negative determination at block 1008, the process of FIG. 10 returns to block 1004, which has been described.

If, however, spare write control logic instance 800 makes an affirmative determination at block 1008, spare write control logic instance 800 asserts Start signal 804 to initiate a store access to the in-service spare partial array 201 (block 1010). In addition, spare write control logic instance 800 converts the encoded Set ID (e.g., an encoded 4-bit value identifying a cache set between 0 and 15 inclusive) to a Set ID Offset (e.g., an encoded 2-bit value identifying one of the 4 cache sets in the in-service spare partial array 201) and asserts the Set ID Offset to select a cache set to be updated in the in-service spare partial array 201. In the embodiment of FIG. 8, spare write control logic instance 800 converts the Set ID to a Set ID Offset suitable for use as select signal 814 by selecting the two lower order bits (0:1) of the Set ID. In response to assertion of Start signal 804 and select signal 814, cache memory 400 updates the selected cache set in the in-service spare partial array 201 with the doubleword of store data pre-loaded into store data latch 724 (block 1014). Thereafter, the process of FIG. 10 ends at block 1016 until initiation of a next write operation of cache memory 400.

Figure 11:
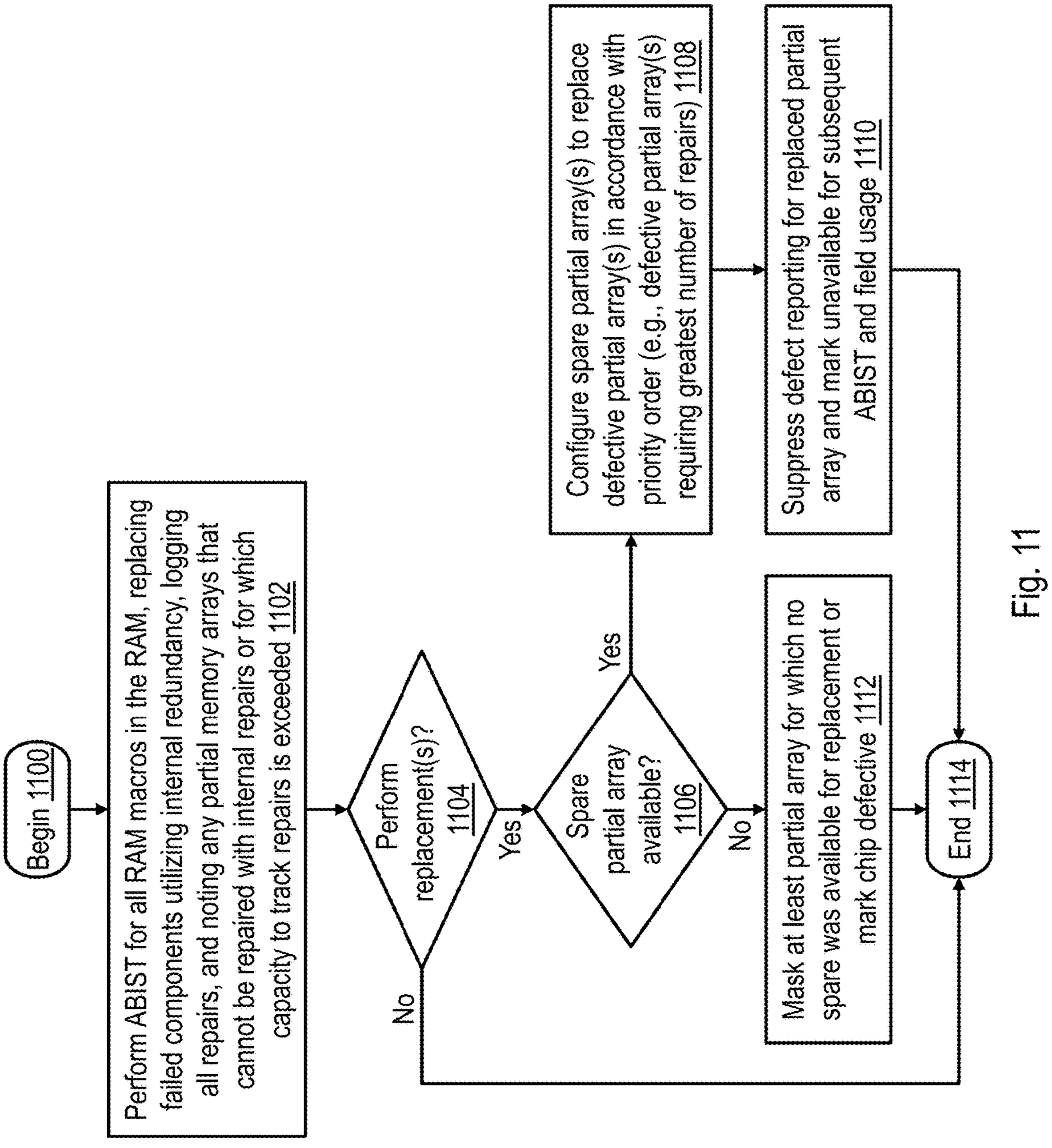
FIG. 11 is high-level logical flowchart of an exemplary method of activating a spare partial array in a cache memory during manufacturing testing in accordance with one or more embodiments.

With reference now to FIG. 11, there is illustrated a high-level logical flowchart of an exemplary method of activating a spare partial array 201 in a cache memory during manufacturing testing in accordance with one or more embodiments. The process of FIG. 11 begins at block 1100 and thereafter proceeds to block 1102, which illustrates the ABIST circuit(s) 230 of a RAM 104, such as a cache memory 400, performing an array built-in self-test (ABIST) for all RAM macros in the RAM 104. As part of the ABIST process, an ABIST circuit 230 preferably directs the replacement of failed components of a RAM macro utilizing the internal redundancy (e.g., extra rows and columns of memory cells 200) with which the RAM macro is provisioned. ABIST circuit 230 also preferably logs, in an internal memory, all repairs made within each RAM macro and preferably notes any partial memory arrays 201 that cannot be repaired utilizing internal redundancy (due to the number and/or locations of repairs) or for which memory capacity available to track repairs is exceeded. It should be noted that ABIST circuit 230 preferably tests the partial arrays of both RAM macros initially placed in-service, as well as RAM macros initially allocated as spares.

At block 1104, ABIST circuit 230 determines whether or not to perform replacement of one or more in-service partial arrays 201, for example, based on one or more factors, including: the number of defects repaired in the partial array(s), the severity of defects detected in the partial array(s), the location of defects detected in the partial array(s), the relative health of the partial array(s) compared to non-failed spare partial array(s), and the expected longevity of the in-service partial array(s) compared to non-failed spare partial array(s). Based on a determination at block 1104 that no replacement is to be performed, the process of FIG. 11 ends at block 1114. However, in response to ABIST circuit 230 determining at block 1104 to replace, if possible, at least one in-service partial array with a spare partial array in a partial array sparing event, the process proceeds to block 1106. Block 1106 depicts ABIST circuit 230 determining whether or not any non-failed spare partial array 201 is available to replace a particular in-service partial array identified for replacement at block 1104. If not, ABIST circuit 230 takes corrective action at block 1112, for example, by masking off part or all of the RAM array containing the particular partial array or by marking the entire integrated circuit chip as defective (e.g., in an unillustrated chip configuration register). Following block 1112, the process of FIG. 11 ends at block 1112.

Returning to block 1106, in response to ABIST circuit 230 determining at block 1106 that at least one non-failed spare partial array 201 is available to replace at least one in-service partial array identified for replacement at block 1104, ABIST circuit 230 replaces one or more in-service partial arrays with a corresponding number of spare partial arrays (block 1108). As indicated, ABIST circuit 230 preferably performs the partial array sparing as spare partial arrays are available in accordance with a priority order based, for example, on the number of defects in the in-service partial array(s). The replacement depicted at block 1108 includes ABIST circuit 230 configuring the fields of the configuration register 502 of each spare partial array placed in-service to assume the characteristics (e.g., DWID, Index, and Set) initially assigned by construction or otherwise to the partial array the spare partial array replaces. At block 1110, ABIST circuit 230 may optionally suppress subsequent defect reporting for the replaced partial array and mark the replaced partial array (e.g., in Def field 510 of the associated configuration register 502) as unavailable for subsequent ABIST testing or field usage. Following block 1110, the process of FIG. 11 ends at block 1114.

Figures 12, 13:
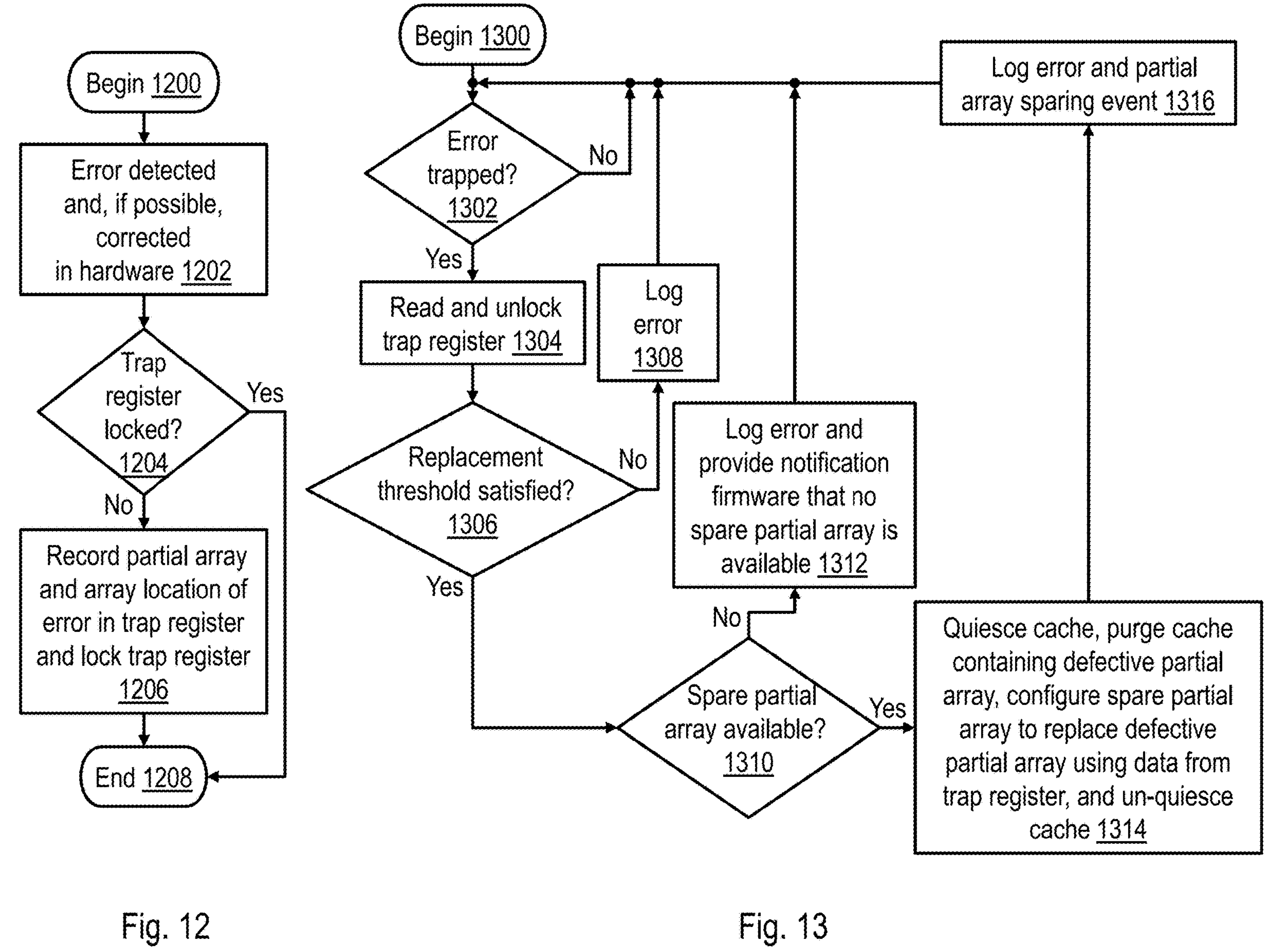
FIG. 12 is high-level logical flowchart of an exemplary method of capturing failures in a memory array during regular operation in accordance with one or more embodiments.
FIG. 13 is high-level logical flowchart of an exemplary method of activating a spare partial array to replace an in-service partial array during regular operation of a memory array in accordance with one or more embodiments.

Referring now to FIG. 12, there is depicted a high-level logical flowchart of an exemplary method of capturing failures in a RAM array during regular operation in accordance with one or more embodiments. To promote understanding, FIG. 12 is described with reference to SRAM macro 200 of FIG. 2.

The process of FIG. 12 begins at block 1200 and then proceeds to block 1202, which illustrates a RAM macro, such as a SRAM macro 200 of FIG. 2, detecting and, if possible, correcting an error in data read from SRAM macro 200. In the embodiment of FIG. 2 described above, the detection and possible correction of the detected error may be performed by ECC circuit 226. In response to detection of the data error, macro controller 210 determines at block 1204 whether or not a trap register 234 associated with the SRAM macro 200 is locked. For example, macro controller 210 may make the determination by testing a lock bit in trap register 234. In response to determining at block 1204 that trap register 234 is locked, the process of FIG. 12 ends at block 1208. If, however, macro controller 210 determines at block 1204 that trap register 234 is unlocked and can thus be updated, macro controller 210 records in trap register 234 identifying information for the partial array in which the data error was detected and an array location of data error and then locks trap register 234 (block 1206). Thereafter, the process of FIG. 12 ends at block 1208.

With reference to FIG. 13, there is illustrated a high-level logical flowchart of an exemplary method of activating a spare partial array as a replacement array during regular operation in accordance with one or more embodiments. The process of FIG. 13 can be performed, for example, by firmware executing on a processor, such as that illustrated in FIG. 1.

The process of FIG. 13 begins at block 1300 and then proceeds to block 1302, which illustrates the firmware polling trap register 234 to determine whether or not a data error has been recorded in trap register 234. In response to a negative determination at bock 1302, the process continues to iterate at block 1302. In response to the firmware determining at block 1302 that an error has been recorded in trap register 234, the firmware reads and unlocks trap register 234 (block 1304). At block 1306, the firmware determines whether or not a replacement threshold for the partial array (or a portion of the partial array) in which the data error was detected has been satisfied. The replacement threshold can be based, for example, on a total number of data errors across the partial array, the type(s) of data errors (e.g., CEs or UEs), and/or the physical concentration of the data errors (e.g., in a particular row or column). In response to a negative determination at block 1306, the firmware logs the data error (block 1308), and the process returns to block 1302, which has been described.

In response to a determination at block 1306 that the replacement threshold is satisfied, the process proceeds to block 1310, which illustrates the firmware determining whether or not a spare partial array 201 is available for use as a replacement. For example, at block 1310 the firmware may examine the Def fields 510 and Valid fields 512 of the configuration registers 502 associated with the partial arrays 201 of spare SRAM macros 410 to qualify a pool of spare partial array(s) 201 as available for use as replacement. In response to a determination at block 1310 that no spare partial array 201 is available to serve as a replacement, the firmware logs the data error and provides a notification to other firmware and/or software (e.g., to a system administrator console) that no spare partial array 201 is available for use as a replacement (block 1312). This notification may cause scheduling of replacement of a system component including the partial array in which the data error was detected. Following block 1312, the process of FIG. 13 returns to block 1302, which has been described.

In response to the firmware determining at block 1310 that the pool of spare partial arrays available to serve as a replacement includes at least one spare partial array 201, the firmware automatically initiates a partial array sparing event, as depicted at block 1314. For example, in at least one embodiment, the firmware quiesces and purges the RAM array (e.g., cache memory) containing the in-service partial array to be replaced. In addition, the firmware configures the spare partial array to replace the other partial array, for example, by updating the configuration register 502 of the spare partial array based on the identifying information for the partial array recorded in trap register 234. For example, in the embodiment depicted in FIGS. 5 and 8, the firmware resets Def field 510, sets Valid field 512, and updates DWID field 514, Index field 516, and Set field 518 so that the spare partial array is placed in service to store the cache sets formerly stored the replaced partial array and maintains the same access timing as the replaced partial array. Following the partial array sparing event, the firmware unquiesces the RAM array in which the replacement was made, restoring the RAM array to normal read and write operation. At block 1316, the firmware also logs the data error and the partial array sparing event. Thereafter, the process returns to block 1302, which has been described.

Figure 14:
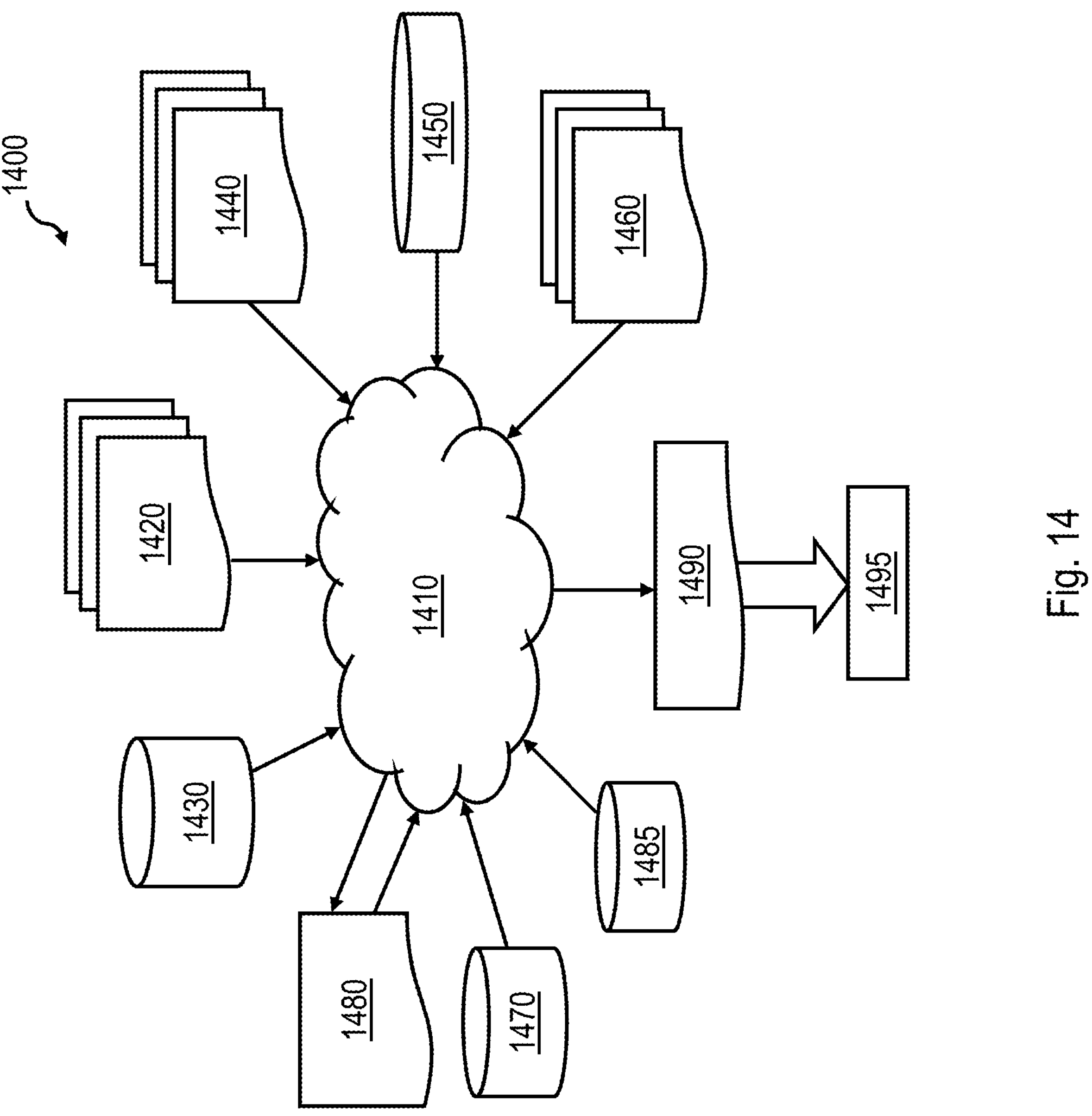
FIG. 14 is a data flow diagram illustrating a design process.

Referring now to FIG. 14, there is depicted a block diagram of an exemplary design flow 1400 used for example, in semiconductor IC logic design, simulation, test, layout, and manufacture. Design flow 1400 includes processes, machines and/or mechanisms for processing design structures or devices to generate logically or otherwise functionally equivalent representations of the design structures and/or devices described above. The design structures processed and/or generated by design flow 1400 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1400 may vary depending on the type of representation being designed. For example, a design flow 1400 for building an application specific IC (ASIC) may differ from a design flow 1400 for designing a standard component or from a design flow 1400 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 1420 that is preferably processed by a design process 1410. Design structure 1420 may be a logical simulation design structure generated and processed by design process 1410 to produce a logically equivalent functional representation of a hardware device. Design structure 1420 may also or alternatively comprise data and/or program instructions that when processed by design process 1410, generate a functional representation of the physical structure of a hardware device. Whether representing functional and/or structural design features, design structure 1420 may be generated using electronic computer-aided design (ECAD) such as implemented by a core developer/designer. When encoded on a machine-readable data transmission, gate array, or storage medium, design structure 1420 may be accessed and processed by one or more hardware and/or software modules within design process 1410 to simulate or otherwise functionally represent an electronic component, circuit, electronic or logic module, apparatus, device, or system such as those shown herein. As such, design structure 1420 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1410 preferably employs and incorporates hardware and/or software modules for synthesizing, translating, or otherwise processing a design/simulation functional equivalent of the components, circuits, devices, or logic structures shown herein to generate a netlist 1480 which may contain design structures such as design structure 1420. Netlist 1480 may comprise, for example, compiled or otherwise processed data structures representing a list of wires, discrete components, logic gates, control circuits, I/O devices, models, etc. that describes the connections to other elements and circuits in an integrated circuit design. Netlist 1480 may be synthesized using an iterative process in which netlist 1480 is resynthesized one or more times depending on design specifications and parameters for the device. As with other design structure types described herein, netlist 1480 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 1410 may include hardware and software modules for processing a variety of input data structure types including netlist 1480. Such data structure types may reside, for example, within library elements 1430 and include a set of commonly used elements, circuits, and devices, including models, layouts, and symbolic representations, for a given manufacturing technology (e.g., different technology nodes, 10 nm, 20 nm, 30 nm, etc.). The data structure types may further include design specifications 1440, characterization data 1450, verification data 1460, design rules 1470, and test data files 1485 which may include input test patterns, output test results, and other testing information. Design process 1410 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1410 without deviating from the scope and spirit of the invention. Design process 1410 may also include modules for performing standard circuit design processes such as timing analysis, verification, design rule checking, place and route operations, etc.

Design process 1410 employs and incorporates logic and physical design tools such as HDL compilers and simulation model build tools to process design structure 1420 together with some or all of the depicted supporting data structures along with any additional mechanical design or data (if applicable), to generate a second design structure 1490. Design structure 1490 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 1420, design structure 1490 preferably comprises one or more files, data structures, or other computer-encoded data or instructions that reside on transmission or data storage media and that when processed by an ECAD system generate a logically or otherwise functionally equivalent form of one or more of the embodiments of the invention shown herein. In one embodiment, design structure 1490 may comprise a compiled, executable HDL simulation model that functionally simulates one or more of the devices shown herein.

Design structure 1490 may also employ a data format used for the exchange of layout data of integrated circuits and/or symbolic data format (e.g., information stored in a GDSII (GDS2), GL1, OASIS, map files, or any other suitable format for storing such design data structures). Design structure 1490 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown herein. Design structure 1490 may then proceed to a stage 1495 where, for example, design structure 1490: proceeds to tape-out, is released to manufacturing, is released to a mask house, is sent to another design house, is sent back to the customer, etc.

As has been described, in one or more embodiments, an integrated circuit includes a semiconductor substrate and integrated circuitry on the semiconductor substrate. The integrated circuitry includes a memory array including a plurality of memory macros including at least first and second memory macros. Each of the plurality of memory macros includes multiple partial arrays and a shared macro controller configured to control read and write access to the multiple partial arrays. The memory array also includes spare access control logic configured to direct an access to a first partial array in the first memory macro to a second partial array in the second memory macro. Supporting partial array sparing increases the maximum number of sparing events without requiring a larger number of spare memory arrays.

In one or more embodiments, the plurality of memory macros includes a third memory macro and the spare access control logic is configured to direct an access to a third partial array in the third memory macro to a fourth partial array in the second memory macro. By permitting spare partial arrays in the same memory macro to be utilized as spares for different memory macros, a greater number of sparing events can be supported.

In one or more embodiments, the integrated circuit can further include an array built-in self-test (ABIST) circuit configured to replace the first partial array with the second partial array. The ABIST circuit thus enables hardware-controlled partial array sparing.

In one or more embodiments, the integrated circuit includes at least one configuration register. The ABIST circuit replaces the first partial array with the second partial array by updating the at least one configuration register. The configuration register provides a facility in the integrated circuit that controls partial array sparing.

In one or more embodiments, the access to the memory array is read access, and read data is returned on a read data return bus of the memory array. The first partial array is assigned a particular data beat among a plurality of data beats on the read data return bus. The spare access control logic is configured to cause the second partial array, which replaced the first partial array, to drive read data on the read data return bus during the particular data beat initially assigned to the first partial array. The technique of partial array sparing thus maintains the access timing prior to the replacement of the first partial array.

In one or more embodiments, each of the plurality of memory macros includes a row address decoder shared by the multiple partial arrays. Sharing of the row address decoder by the partial arrays of the second memory macro reduces integrated circuit floorplan area utilized to support array sparing.

In one or more embodiments, the memory array comprises an embedded static random access memory (SRAM). SRAM memory arrays provide high performance storage and can be fabricated utilizing known techniques.

In some embodiments, a design structure is tangibly embodied in a machine-readable storage device for designing, manufacturing, or testing an integrated circuit. The design structure comprises an integrated circuit, including a semiconductor substrate and integrated circuitry on the semiconductor substrate. The integrated circuitry includes a memory array including a plurality of memory macros including at least first and second memory macros. Each of the plurality of memory macros includes multiple partial arrays and a shared macro controller configured to control read and write access to the multiple partial arrays. The memory array also includes spare access control logic configured to direct an access to a first partial array in the first memory macro to a second partial array in the second memory macro. Supporting partial array sparing increases the maximum number of sparing events without requiring a larger number of spare memory arrays.

In one or more embodiments, a method of operating a memory array includes replacing, in a memory array including a plurality of memory macros including at least first and second memory macros, wherein each of the plurality of memory macros includes multiple partial arrays and a shared macro controller configured to control read and write access to the multiple partial arrays, the first partial array in the first memory macro with a second partial array in the second memory macro in a partial sparing event. Thereafter, a spare access control circuit in the memory array directs an access to the first partial array in the first memory macro to the second partial array in the second memory macro.

While various embodiments have been particularly shown and described, it will be understood by those skilled in the art that various changes in form and detail may be made therein without departing from the spirit and scope of the appended claims and these alternate implementations all fall within the scope of the appended claims. For example, although aspects have been described with respect to a computer system executing program code that directs the functions of the present invention, it should be understood that present invention may alternatively be implemented as a program product including a computer-readable storage device storing program code that can be processed by a processor of a data processing system to cause the data processing system to perform the described functions. The computer-readable storage device can include volatile or non-volatile memory, an optical or magnetic disk, or the like, but excludes non-statutory subject matter, such as propagating signals per se, transmission media per se, and forms of energy per se.

As an example, the program product may include data and/or instructions that when executed or otherwise processed on a data processing system generate a logically, structurally, or otherwise functionally equivalent representation (including a simulation model) of hardware components, circuits, devices, or systems disclosed herein. Such data and/or instructions may include hardware-description language (HDL) design entities or other data structures conforming to and/or compatible with lower-level HDL design languages such as Verilog and VHDL, and/or higher level design languages such as C or C++. Furthermore, the data and/or instructions may also employ a data format used for the exchange of layout data of integrated circuits and/or symbolic data format (e.g. information stored in a GDSII (GDS2), GL1, OASIS, map files, or any other suitable format for storing such design data structures).

The following definitions are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, system or apparatus that comprises a list of elements is not necessarily limited to only those elements but can include other elements not expressly listed or inherent to such composition, mixture, process, method, article, system or apparatus.

Additionally, the term "exemplary" is used herein to mean "serving as one example, instance or illustration." Any embodiment or design described herein as "exemplary" is not necessarily to be construed as preferred or advantageous over other embodiments or designs. The terms "at least one" and "one or more" shall be understood to include any integer number greater than or equal to one, and the term "plurality" shall be understood to include any integer number greater than or equal to two. The term "coupled" shall include both indirect connection and a direct connection, unless specified otherwise in a particular case. The terms "about," "substantially," "approximately," and variations thereof, are intended to include the degree of error associated with measurement of the particular quantity based upon the equipment available at the time of filing the application. For example, "about" can include a range of ±10% or ±5%, or ±2% of a given value.

The figures described herein and the written description of specific structures and functions are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. For the sake of brevity, conventional techniques related to making and using aspects of the invention(s) may or may not be described in detail herein, and many conventional implementation details are only mentioned briefly or are omitted entirely. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. An integrated circuit, comprising:
- a semiconductor substrate;
- integrated circuitry on the semiconductor substrate, wherein the integrated circuitry includes a memory array including:
  - a plurality of memory macros including at least first and second memory macros, wherein each of the plurality of memory macros includes:
    - multiple partial arrays, wherein each of the multiple partial arrays is associated with its own respective write driver, sense amplifier, and output buffer; and
    - a shared macro controller configured to control read and write access to the multiple partial arrays; and
  - spare access control logic configured to direct an access to a first partial array in the first memory macro to a second partial array in the second memory macro.

2. The integrated circuit of claim 1, wherein:
- the plurality of memory macros includes a third memory macro; and
- the spare access control logic is configured to direct an access to a third partial array in the third memory macro to a fourth partial array in the second memory macro.

3. The integrated circuit of claim 1, further comprising:
- an array built-in self-test (ABIST) circuit configured to replace the first partial array with the second partial array.

4. The integrated circuit of claim 3, wherein:
- the integrated circuit includes at least one configuration register; and
- the ABIST circuit replaces the first partial array with the second partial array by updating the at least one configuration register.

5. The integrated circuit of claim 1, wherein:
- the access is a read access;
- the memory array includes a read data return bus having a plurality of data beats, wherein the first partial array is assigned a particular data beat among the plurality of data beats;
- the spare access control logic is configured to cause the second partial array to drive read data on the read data return bus during the particular data beat.

6. The integrated circuit of claim 1, wherein each of the plurality of memory macros includes a row address decoder shared by the multiple partial arrays.

7. The integrated circuit of claim 1, wherein the memory array comprises an embedded static random access memory (SRAM).

8. A design structure tangibly embodied in a non-transitory machine-readable storage device for designing, manufacturing, or testing an integrated circuit, the design structure comprising:
- an integrated circuit, including:
- a semiconductor substrate;
- integrated circuitry on the semiconductor substrate, wherein the integrated circuitry includes a memory array including:
  - a plurality of memory macros including at least first and second memory macros, wherein each of the plurality of memory macros includes:

multiple partial arrays, wherein each of the multiple partial arrays is associated with its own respective write driver, sense amplifier, and output buffer; and a shared macro controller configured to control read and write access to the multiple partial arrays; and spare access control logic configured to direct an access to a first partial array in the first memory macro to a second partial array in the second memory macro.

9. The design structure of claim 8, wherein:

the plurality of memory macros includes a third memory macro; and the spare access control logic is configured to direct an access to a third partial array in the third memory macro to a fourth partial array in the second memory macro.

10. The design structure of claim 8, further comprising:

an array built-in self-test (ABIST) circuit configured to replace the first partial array with the second partial array.

11. The design structure of claim 10, wherein:

the integrated circuit includes at least one configuration register; and the ABIST circuit replaces the first partial array with the second partial array by updating the at least one configuration register.

12. The design structure of claim 8, wherein:

the access is a read access;

the memory array includes a read data return bus having a plurality of data beats, wherein the first partial array is assigned a particular data beat among the plurality of data beats;

the spare access control logic is configured to cause the second partial array to drive read data on the read data return bus during the particular data beat.

13. The design structure of claim 8, wherein each of the plurality of memory macros includes a row address decoder shared by the multiple partial arrays.

14. The design structure of claim 8, wherein the memory array comprises an embedded static random access memory (SRAM).

15. A method of operating a memory array, comprising:

in a memory array including a plurality of memory macros including at least first and second memory macros, wherein each of the plurality of memory macros includes:

multiple partial arrays, wherein each of the multiple partial arrays is associated with its own respective write driver, sense amplifier, and output buffer; and a shared macro controller configured to control read and write access to the multiple partial arrays, replacing the first partial array in the first memory macro with a second partial array in the second memory macro in a partial sparing event; and thereafter, a spare access control circuit in the memory array directing an access to the first partial array in the first memory macro to the second partial array in the second memory macro.

16. The method of claim 15, wherein:

the plurality of memory macros includes a third memory macro; and the method further includes:

replacing a third partial array in a third memory macro with a fourth partial array in the second memory macro in a partial sparing event; and thereafter, the spare access control circuit directing an access to the third partial array in the third memory macro to the fourth partial array in the second memory macro.

17. The method of claim 15, wherein the replacing includes:

an array built-in self-test (ABIST) circuit replacing the first partial array with the second partial array.

18. The method of claim 17, wherein:

the integrated circuit includes at least one configuration register; and the replacing includes the ABIST circuit updating the at least one configuration register.

19. The method of claim 15, wherein:

the access is a read access;

the memory array includes a read data return bus having a plurality of data beats, wherein the first partial array is assigned a particular data beat among the plurality of data beats;

the method further includes the spare access control circuit causing the second partial array to drive read data on the read data return bus during the particular data beat.

20. The method of claim 15, wherein:

each of the plurality of memory macros includes a row address decoder shared by the multiple partial arrays; and the method further comprises the row address decoder, based on the access, asserting a wordline shared by the multiple partial arrays.

* * * * *